(12) United States Patent
Bottomley et al.

(10) Patent No.: US 6,697,441 B1
(45) Date of Patent: Feb. 24, 2004

(54) BASEBAND PROCESSORS AND METHODS AND SYSTEMS FOR DECODING A RECEIVED SIGNAL HAVING A TRANSMITTER OR CHANNEL INDUCED COUPLING BETWEEN BITS

(75) Inventors: Gregory Edward Bottomley, Cary, NC (US); Paul Wilkinson Dent, Pittsboro, NC (US); Ali S. Khayrallah, Apex, NC (US); Huseyin Arslan, Durham, NC (US)

(73) Assignee: Ericsson Inc., Research Triangle Park, NC (US)

( * ) Notice: Subject to any disclaimer, the term of this patent is extended or adjusted under 35 U.S.C. 154(b) by 695 days.

(21) Appl. No.: 09/587,995

(22) Filed: Jun. 6, 2000

(51) Int. Cl.⁷ .............................................. H04L 27/22

(52) U.S. Cl. ................... 375/340; 375/324; 714/786

(58) Field of Search ............................. 375/340, 341, 375/316, 324; 714/786, 794

(56) References Cited

U.S. PATENT DOCUMENTS

| | | | |
|---|---|---|---|
| 4,631,735 A | 12/1986 | Qureshi | 375/34 |
| 5,233,630 A | 8/1993 | Wolf | 375/67 |
| 5,438,590 A | 8/1995 | Tzukerman et al. | 375/259 |
| 5,673,291 A | 9/1997 | Dent | 375/262 |
| 6,269,116 B1 * | 7/2001 | Javerbring et al. | 375/229 |
| 6,535,497 B1 | 3/2003 | Raith | 370/336 |
| 6,567,481 B1 * | 5/2003 | Molnar | 375/341 |

FOREIGN PATENT DOCUMENTS

| | | |
|---|---|---|
| WO | WO 98/04047 | 1/1998 |
| WO | WO 98/59423 | 12/1998 |

OTHER PUBLICATIONS

L.R. Bahl, J. Cocke, F. Jelinek and J. Raviv, *Optimal Decoding of Linear Codes for Minimizing Symbol Error Rate*, IEEE Trans. Inform. Thy., pp. 284–287, Mar. 1974.

H. Shankar, *Emerging Technology Series #1 Edge in Wireless Data*, Commdesign, Online!, Jan. 2000, pp. 1–7.

International Search Report for PCT/US01/46036.

International Search Report for PCT/US01/16041.

Raphaeli, Dan et al., "Combined Turbo Equalization and Turbo Decoding", IEEE Communication Letters, vol. 2, No. 4, Apr. 1998, pp. 107–109.

(List continued on next page.)

*Primary Examiner*—Amanda T. Le
(74) *Attorney, Agent, or Firm*—Myers Bigel Sibley & Sajovec

(57) ABSTRACT

Received signals are decoded based on a coupling between bits of the received signals introduced by the channel over which the signal is transmitted or by the transmitter which transmitted the signals. For example, in a higher-order modulation scheme, such as 8-PSK, individual bits grouped in a given symbol are generally coupled rather than fully independent. Accordingly, decoding information on a first one of the bits processed through a forward error correction decoder may be used to adjust the soft information from a demodulator for one or more of the other bits contained in the same symbol for use in processing those bits through the forward error correction decoder. Particularly where interleaving is utilized, a first bit may be processed through the decoder before the soft information on another of the bits is needed, thereby allowing an intermediate decision soft value for the first bit to be used in generating the input value to the decoder for the subsequent bit. Alternatively, a multi-pass process may be utilized which may allow all of the bits to be decoded utilizing soft information from the first decoding pass to affect the input to the decoder during the second pass for coupled bits such as those transmitted in a common symbol.

51 Claims, 12 Drawing Sheets

OTHER PUBLICATIONS

Tonello, Andrea M., "Interative MAP detection of coded M–DPSK signals in fading channels with application to IS–136 TDMA", IEEE, 1999, pp. 1615–1619.

Jung–Fu Cheng and Lin–shan Lee, *Complexity–Reduced Multilevel Coding with Rate–Compatible Punctured Convolutional Codes, IEEE Global Telecommunications Conference 1993*, Houston Texas.

A. Mark Earnshaw, *Combined Soft–Decision Deinterleaver/ Decoder for the IS95 ReverseLink, IEEE Transactions on Vehicular Technology*, vol. 49, No. 2, 3/2000.

* cited by examiner

BASEBAND PROCESSORS AND METHODS AND SYSTEMS FOR DECODING A RECEIVED SIGNAL HAVING A TRANSMITTER OR CHANNEL INDUCED COUPLING BETWEEN BITS

BACKGROUND OF THE INVENTION

The present invention relates to signal communications and, in particular, to reception of encoded and modulated signals over a communications channel.

One type of communications channel which is expanding particularly rapidly is wireless communications, particularly as more radio spectrum becomes available for commercial use and as cellular phones become more commonplace. In addition, analog wireless communications are gradually being supplemented and even replaced by digital communications. In digital voice communications, speech is typically represented by a series of bits which may be modulated and transmitted from a base station of a cellular communications network to a mobile terminal device such as a cellular phone. The phone may demodulate the received waveform to recover the bits, which are then converted back into speech. In addition to voice communications, there is also a growing demand for data services, such as e-mail and Internet access, which typically utilize digital communications.

There are many types of digital communications systems. Traditionally, frequency-division-multiple-access (FDMA) is used to divide the spectrum up into a plurality of radio channels corresponding to different carrier frequencies. These carriers may be further divided into time slots, generally referred to as time-division-multiple-access (TDMA), as is done, for example, in the digital advanced mobile phone service (D-AMPS) and the global system for mobile communication(GSM) standard digital cellular systems. Alternatively, if the radio channel is wide enough, multiple users can use the same channel using spread spectrum techniques and code-division-multiple-access (CDMA).

A typical digital communications system 19 is shown in FIG. 1. Digital symbols are provided to the transmitter 20, which maps the symbols into a representation appropriate for the transmission medium or channel (e.g. radio channel) and couples the signal to the transmission medium via antenna 22. The transmitted signal passes through the channel 24 and is received at the antenna 26. The received signal is passed to the receiver 28. The receiver 28 includes a radio processor 30, a baseband signal processor 32, and a post processing unit 34.

The radio processor typically tunes to the desired band and desired carrier frequency, then amplifies, mixes, and filters the signal to a baseband. At some point the signal may be sampled and quantized, ultimately providing a sequence of baseband received samples. As the original radio signal generally has in-phase (I) and quadrature (Q) components, the baseband samples typically have I and Q components, giving rise to complex, baseband samples.

The baseband processor 32 may be used to detect the digital symbols that were transmitted. It may produce soft information as well, which gives information regarding the likelihood of the detected symbol values. The post processing unit 34 typically performs functions that depend on the particular communications application. For example, it may convert digital symbols into speech using a speech decoder.

A typical transmitter is shown in FIG. 2. Information bits, which may represent speech, images, video, text, or other content material, are provided to forward-error-correction (FEC) encoder 40, which encodes some or all of the information bits using, for example, a convolutional encoder. The FEC encoder 40 produces coded bits, which are provided to an interleaver 42, which reorders the bits to provide interleaved bits. These interleaved bits are provided to a modulator 44, which applies an appropriate modulation for transmission. The interleaver 42 may perform any type of interleaving. One example is block interleaving, which is illustrated in FIG. 3. Conceptually, bits are written into rows of a table, then read out by column. FIG. 3 shows an example of 100 bits, written into a 10×10 table.

Another example of interleaving is diagonal interleaving, in which data from different frames are interleaved together. Diagonal interleaving is illustrated in FIG. 4. Each frame is block interleaved using block interleavers 50a, 50b, and 50c. Using switches 52a, 52b, and 52c, interleaved bits from each frame are split into two groups. The multiplexors 54a and 54b combine groups of bits from different frames to form transmit frames. In TDMA systems, different transmit frames generally would be sent in different time slots.

The modulator 44 may apply any of a variety of modulations. Higher-order modulations, such as those illustrated in FIGS. 5A and 5B, are frequently utilized. One example is 8-PSK (eight phase shift keying), in which 3 bits are sent using one of 8 constellation points in the in-phase (I)/quadrature (Q) (or complex) plane. In FIG. 5A, 8-PSK with Gray coding is shown in which adjacent symbols differ by only one bit. Another example is 16-QAM (sixteen quadrature amplitude modulation), in which 4 bits are sent at the same time as illustrated in FIG. 5B. Higher-order modulation may be used with conventional, narrowband transmission as well as with spread-spectrum transmission.

A conventional baseband processor is shown in FIG. 6. A baseband received signal is provided to the demodulator and soft information generator 60 which produces soft bit values. These soft bit values are provided to the soft information de-interleaver 62 which reorders the soft bit values to provide de-interleaved soft bits. These de-interleaved soft bits are provided to the FEC decoder 64 which performs, for example, convolutional decoding, to produce detected information bits.

A second example of a conventional baseband processor is shown in FIG. 7. This processor employs multipass equalization, in which results, after decoding has completed, are passed back to the equalization circuit to re-equalize, and possibly re-decode, the received signal. Such a system is described, for example, in U.S. Pat. No. 5,673,291 to Dent et al. entitled "Simultaneous demodulation and decoding of a digitally modulated radio signal using known symbols" which is hereby incorporated herein by reference. For the circuit illustrated in FIG. 7, the processor typically initially performs conventional equalization and decoding. After decoding, the detected information bits are re-encoded in the re-encoder 74 and then re-interleaved in the re-interleaver 72 to provide information to the multipass equalizer and soft information generator 70 which re-equalizes the received baseband signal using the detected bit values. Typically, because of diagonal interleaving or the fact that some bits are not convolutionally encoded, the second pass effectively uses error corrected bits, as determined and corrected in the first pass, to help detection of other bits, such as bits which were not error correction encoded.

Both single pass and multipass baseband processors as described above typically use conventional forward error correction (FEC) decoders. Conventional FEC decoders typically treat each soft bit value as if it were independent of all other values. For example, in a Viterbi decoder for convolutional codes, soft bit values are generally correlated to hypothetical code bit values and added. As the soft bit values typically correspond to loglikelihood values, adding soft values corresponds to adding loglikelihoods or multiplying probabilities. As the Viterbi decoder corresponds to maximum likelihood sequence estimation (MLSE) decoding, multiplying probabilities generally assumes that the noise on each bit value is independent.

For lower-order modulation, with Nyquist pulse shaping and nondispersive channels, independent noise is often a reasonable assumption. For example, for quadrature phase shift keyed (QPSK) modulation, one bit is generally sent on the I component and a second bit is sent on the Q component. Because noise is typically uncorrelated between the I and Q components, the noise on these two bits would generally be independent. However, with higher-order modulation, noise values on the different bits are generally not independent. Consider the 8-PSK example shown in FIG. 5A. As 3 bits are affected by only 2 independent noise values (I and Q noise components), the noise on the 3 soft bit values is expected to be correlated. Thus, with higher-order modulation, the conventional approaches to demodulation and decoding ignore the fact that bit soft values may be related through correlated noise. As a result, performance may be reduced.

In a more general sense, bit likelihoods may be coupled in many ways. For 8-PSK with Nyquist pulse shaping, groups of 3 bits are generally coupled by the modulation. With partial response pulse shaping, overlapping groups of bits may be coupled through the pulse shape. Differential modulation may also couple successive symbols. Bit coupling may also be introduced by the communication channel, for example, bit coupling may result from multipath time dispersion, in which symbols overlap with one another, for example, due to signal echoes.

SUMMARY OF THE INVENTION

In embodiments of the present invention, methods for decoding a signal received over a channel from a transmitter are provided. The methods include decoding a received signal having a first bit and a second bit based on a coupling of the first bit to the second bit introduced by at least one of the channel or the transmitter.

In other embodiments of the present invention, baseband processors are provided for decoding a signal received over a channel from a transmitter. The baseband processor in various embodiments includes a demodulator that demodulates the received signal to provide demodulator soft information associated with a plurality of bits in the received signal. An intermediate value memory configured to store the demodulator soft information associated with a plurality of bits in the received signal is also provided. The baseband processor further includes a soft information generator circuit coupled to the intermediate value memory. A decoder is provided configured to process soft information associated with the plurality of bits in the received signal from the soft information generator circuit to provide decoder soft information associated with ones of the plurality of bits in the received signal. The soft information generator circuit is configured to generate the soft information associated with the plurality of bits in the received signal based on a coupling of one of the plurality of bits to another of the plurality of bits introduced by at least one of the channel or the transmitter and responsive to the demodulator soft information associated with the plurality of bits.

As will further be appreciated by those of skill in the art, the present invention may be embodied as methods, systems and/or baseband processors.

DETAILED DESCRIPTION OF THE INVENTION

Figure 1:
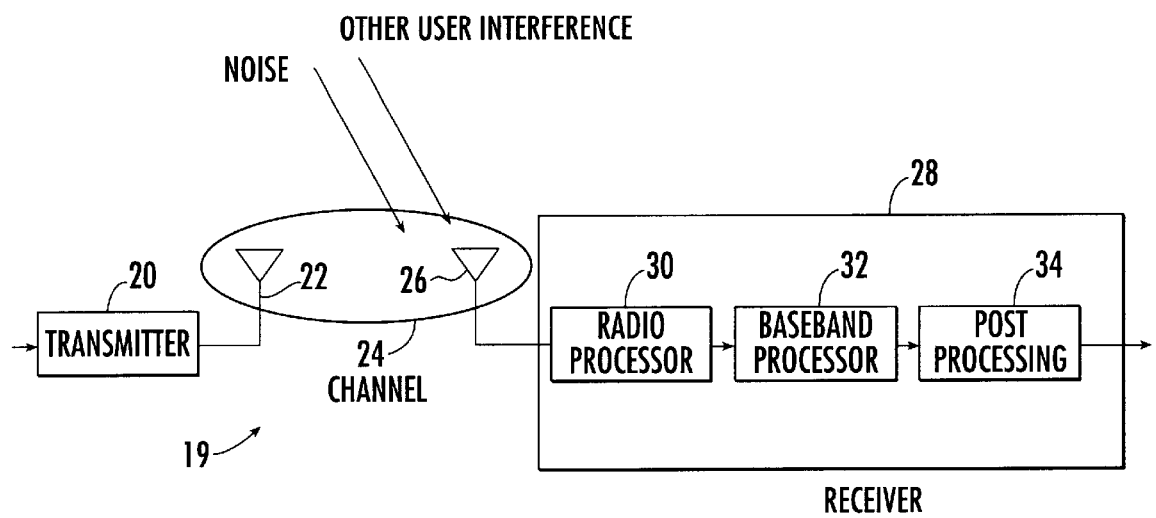
FIG. 1 is a block diagram illustrating a conventional communication system.
Figure 2:
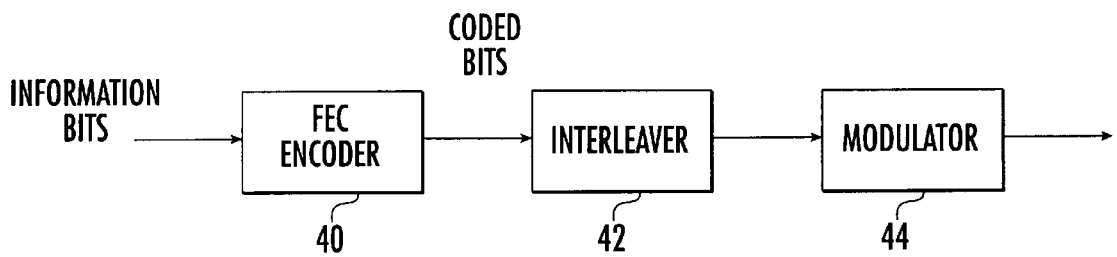
FIG. 2 is a block diagram illustrating a conventional transmitter.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. As will be appreciated by those of skill in the art, the present invention may be embodied as methods or devices. Accordingly, the present invention may take the form of a hardware embodiment, a software embodiment or an embodiment combining software and hardware aspects.

The present invention will first be described with reference to the block diagram illustration of FIG. 8 which depicts an embodiment of a baseband processor 20 according to the present invention. It is to be understood that baseband processors of the present invention may be utilized in a variety of communication devices, including wireless communication devices such as wireless terminals including mobile terminals. Mobile terminals typically include a transmitter, a receiver, a user interface and an antenna system. The antenna system may include an antenna feed structure and one or more antennas. The antenna system may be coupled to the baseband processor through circuitry, such as an RF processor, configured to step up signals for transmission to an assigned transmission frequency or to step down received signals from a modulation frequency to a baseband frequency. However, the baseband processor in some applications may couple directly to the antenna systems.

As is well known to those of skill in the art, the transmitter converts the information which is to be transmitted by the mobile terminal into an electromagnetic signal suitable for radio communications. The receiver demodulates electromagnetic signals which are received by the mobile terminal so as to provide the information contained in the signals to the user interface in a format which is understandable to the user. The receiver generally includes an RF processor and a baseband processor, in particular, a baseband processor of the present invention may be beneficially utilized as will be further described herein. A wide variety of transmitters, receivers, and user interfaces (e.g., microphones, keypads, displays) which are suitable for use with handheld radiotelephones are known to those of skill in the art, and such devices may be implemented in a radiotelephone including a baseband processor in accordance with the present invention. Other than the baseband processor according to the present invention, the design of such a radiotelephone is well known to those of skill in the art and will not be further described herein. It is further to be understood that the present invention is not limited to radiotelephones and may also be utilized with other wireless and wired communication receivers and further for communications with computer storage medium, such as magnetic storage devices, to extract data.

The present invention is generally described herein in the context of a wireless terminal. As used herein, the term "wireless terminal" may include a cellular radiotelephone with or without a multi-line display; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver. Wireless terminals may also be referred to as "pervasive computing" devices.

As will be described, the present invention provides methods for decoding a signal received over a channel from a transmitter. The methods may include decoding a received signal having a first bit and a second bit based on a coupling of the first bit to the second bit introduced by at least one of the channel or the transmitter. The coupling of the first bit to the second bit introduced by at least one of the channel or the transmitter may be provided by at least one of a modulation scheme used at the transmitter to generate a symbol for transmission including the first bit and the second bit, pulse shaping used at the transmitter and multi-path dispersion of the channel. The modulation scheme may be 8-PSK and the pulse shaping may be Nyquist pulse shaping. The pulse shaping may also be partial response pulse shaping.

In embodiments of the present invention, decoding operations include demodulating the received signal to provide unadjusted soft information associated with the first bit. The received signal is forward error correction decoded based on the provided unadjusted soft information associated with the first bit. Soft information associated with the second bit is provided based on the forward error correction decoding of the first bit and the coupling of the second bit to the first bit to provide adjusted soft information associated with the second bit. The forward error correction decoding of the received signal may further be based on the adjusted soft information associated with the second bit. In one embodiment, the forward error correction decoding operations include forward error correction decoding the first bit based on the unadjusted soft information associated with the first bit and forward error correction decoding the second bit based on the adjusted soft information associated with the second bit.

In further embodiments of the present invention, first state soft information associated with the second bit is provided based on a first state path history for the first bit and second state soft information associated with the second bit is provided based on a second state path history for the first bit.

In other embodiments of the present invention, forward error correction decoding is performed using a fixed-lag MAP decoder to produce likelihoods associated with the first bit and the second bit based on partially processed received symbols. In a further embodiment, forward error correction decoding may be performed using a maximum likelihood sequence estimation (MLSE) decoder using a soft output Viterbi algorithm (SOVA). In yet another embodiment, the forward error correction decoding is performed using a block code with soft decoding based on a trellis. The soft information may be a conditional loglikelihood associated with the second bit.

In further embodiments of the present invention, the soft information associated with the second bit may be provided as follows. A plurality of symbol loglikelihoods associated with the second bit are provided. The plurality of symbol loglikelihoods are exponentiated to generate symbol pseudo-likelihoods. Scaling factors are generated for the plurality of symbol pseudo-likelihoods based on the unadjusted soft information associated with the first bit. The scaling factors are applied to the plurality of symbol pseudo-likelihoods. Each of the scaled plurality of symbol pseudo-likelihoods are accumulated in one of a first accumulator associated with a first bit state and a second accumulator associated with a second bit state. A first logarithmic value is then generated from the first accumulator and a second logarithmic value is generated from the second accumulator. The difference between the first logarithmic value and the second logarithmic value is output as the adjusted soft information associated with the second bit.

In other embodiments of the present invention the soft information associated with the second bit may be provided as follows. A plurality of symbol loglikelihoods associated with the second bit are provided. Ones of the plurality of symbol loglikelihoods are selected based on the unadjusted soft information associated with the first bit. Each of the selected ones of the plurality of symbol loglikelihoods are passed to one of a first register associated with a first bit state and a second register associated with a second bit state. One of the passed plurality of symbol loglikelihoods is selected for each of the first register and the second register, such as selecting a maximum value out of the values passed to the respective register. The difference between the selected one of the passed plurality of symbol loglikelihoods for the first register and the second register is output as the adjusted soft information associated with the second bit.

In further embodiments of the present invention in which the coupling of the first bit to the second bit is introduced by a modulation scheme used at the transmitter to generate a symbol for transmission including the first bit and the second bit, decoding operations include demodulating the received signal to provide demodulator intermediate soft values associated with the first bit and the second bit. The received signal is decoded to provide decoder intermediate soft value information for the first bit when a sufficient set of demodulated signal information is available. It is determined whether the decoder intermediate soft value information for the first bit is available. An output demodulator soft value associated with the second bit is generated based on the decoder intermediate soft value information for the first bit and the demodulator intermediate soft value associated with the second bit if the decoder intermediate soft value information for the first bit is available. The demodulator intermediate soft value associated with the second bit is provided as the output demodulator soft value associated with the second bit if the decoder intermediate soft value information for the first bit is not available. The received signal may then be decoded based on the output demodulator soft value associated with the second bit.

In other embodiments of the present invention, a start bit for initiating decoding of the received signal is selected based on demodulator intermediate soft values associated with bits of the received signal. Decoding of the received signal is initiated with the selected start bit.

In yet other embodiments of the present invention, decoding operations include demodulating the received signal to provide unadjusted soft information associated with the first bit and unadjusted soft information associated with the second bit. The received signal is forward error correction decoded based on the provided unadjusted soft information associated with the first bit and the provided unadjusted soft information associated with the second bit. Soft information associated with the second bit is provided based on the forward error correction decoding of the first bit and the coupling of the second bit to the first bit to provide adjusted soft information associated with the second bit. Soft information associated with the first bit is provided based on the forward error correction decoding of the second bit and the coupling of the second bit to the first bit to provide adjusted soft information associated with the first bit. The first bit and the second bit may then be forward error correction decoded based on the adjusted soft information associated with the first bit and the second bit. The multipass operations including providing soft information and forward error correction decoding of the first bit and the second bit may be repeated for a plurality of passes with updated soft information associated with the first bit and the second bit from a pass being utilized in a subsequent pass until a quality criteria is satisfied. The quality criteria may be a successful error detection code test. The multipass operations may be repeated for a selected number of passes with updated soft information associated with the first bit and the second bit from a pass being utilized in a subsequent pass.

In further embodiments of the present invention decoding operations include demodulating the received signal to provide demodulator intermediate soft values associated with the first bit and the second bit. The demodulator intermediate soft values are stored. The received signal is forward error correction decoded based on the demodulator intermediate soft values to provide decoder intermediate soft values associated with the first bit and the second bit. The demodulator intermediate soft values are adjusted based on the decoder intermediate soft values associated with the first bit and the second bit. The forward error correction decoding operations are then repeated using the adjusted demodulator intermediate soft values.

In other embodiments of the present invention, baseband processors are provided for decoding a signal received over a channel from a transmitter. The baseband processor in various embodiments includes a demodulator that demodulates the received signal to provide demodulator soft information associated with a plurality of bits in the received signal. An intermediate value memory configured to store the demodulator soft information associated with a plurality of bits in the received signal is also provided. The baseband processor further includes a soft information generator circuit coupled to the intermediate value memory. A decoder is provided configured to process soft information associated with the plurality of bits in the received signal from the soft information generator circuit to provide decoder soft information associated with ones of the plurality of bits in the received signal. The soft information generator circuit is configured to generate the soft information associated with the plurality of bits in the received signal based on a coupling of one of the plurality of bits to another of the plurality of bits introduced by at least one of the channel or the transmitter and responsive to the demodulator soft information associated with the plurality of bits. The soft information generator circuit may be an interactive soft information generator circuit and the decoder may be a forward error correction (FEC) decoder with intermediate output.

In further embodiments of the present invention, the interactive soft information generator circuit includes an exponentiation circuit configured to receive the demodulator soft information that exponentiates the demodulator soft information and a scaling circuit coupled to the exponentiation circuit that scales the exponentiated soft information responsive to the decoder soft information associated with ones of the plurality of bits in the received signal. An accumulation circuit is also provided in the interactive soft generator circuit, the accumulation circuit having a first accumulator that accumulates scaled exponentiated soft information associated with a first bit state and a second accumulator that accumulates scaled exponentiated soft information associated with a second bit state. Finally, a combiner circuit outputs a difference between a logarithm of the accumulated scaled exponentiated soft information associated with a first bit state and a logarithm of the accumulated scaled exponentiated soft information associated with a second bit state as the soft information associated with the plurality of bits in the received signal.

In other embodiments of the present invention, the interactive soft information generator circuit includes a gating circuit configured to output demodulator soft information associated with the plurality of bits in the received signal responsive to the soft information associated with the plurality of bits so as to selectively output demodulator soft information associated with symbol states indicated by the soft information associated with the plurality of bits The soft information generator circuit further includes a best value selection circuit having a first register that stores a best demodulator soft information output associated with a first bit state and a second register that stores a best demodulator soft information output associated with a second bit state. A combiner circuit outputs a difference the best demodulator soft information output associated with the first bit state and the best demodulator soft information output associated with the second bit state as the soft information associated with the plurality of bits in the received signal. The soft information generator circuit may be a multipass soft information generator circuit and the decoder may be a FEC decoder with soft coded bit output. The soft information generator circuit may also be a per survivor processing (PSP) interactive soft information generator circuit and the decoder may be a PSP forward error correction (FEC) decoder with intermediate output.

Figure 3:
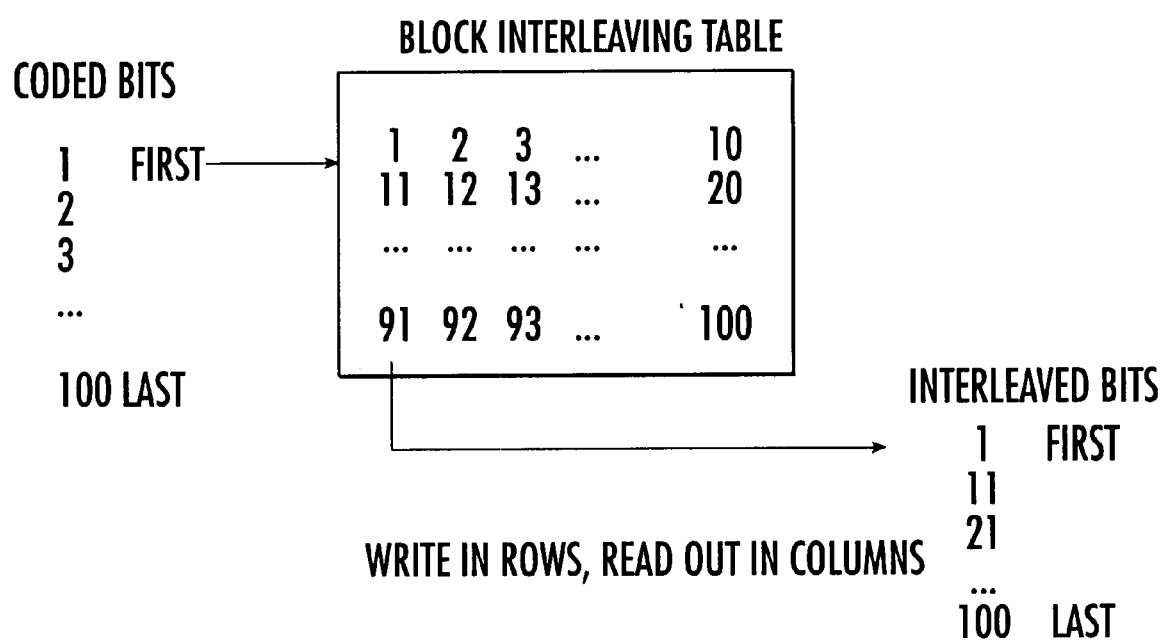
FIG. 3 is a schematic diagram illustrating an exemplary conventional block interleaving circuit.
Figure 4:
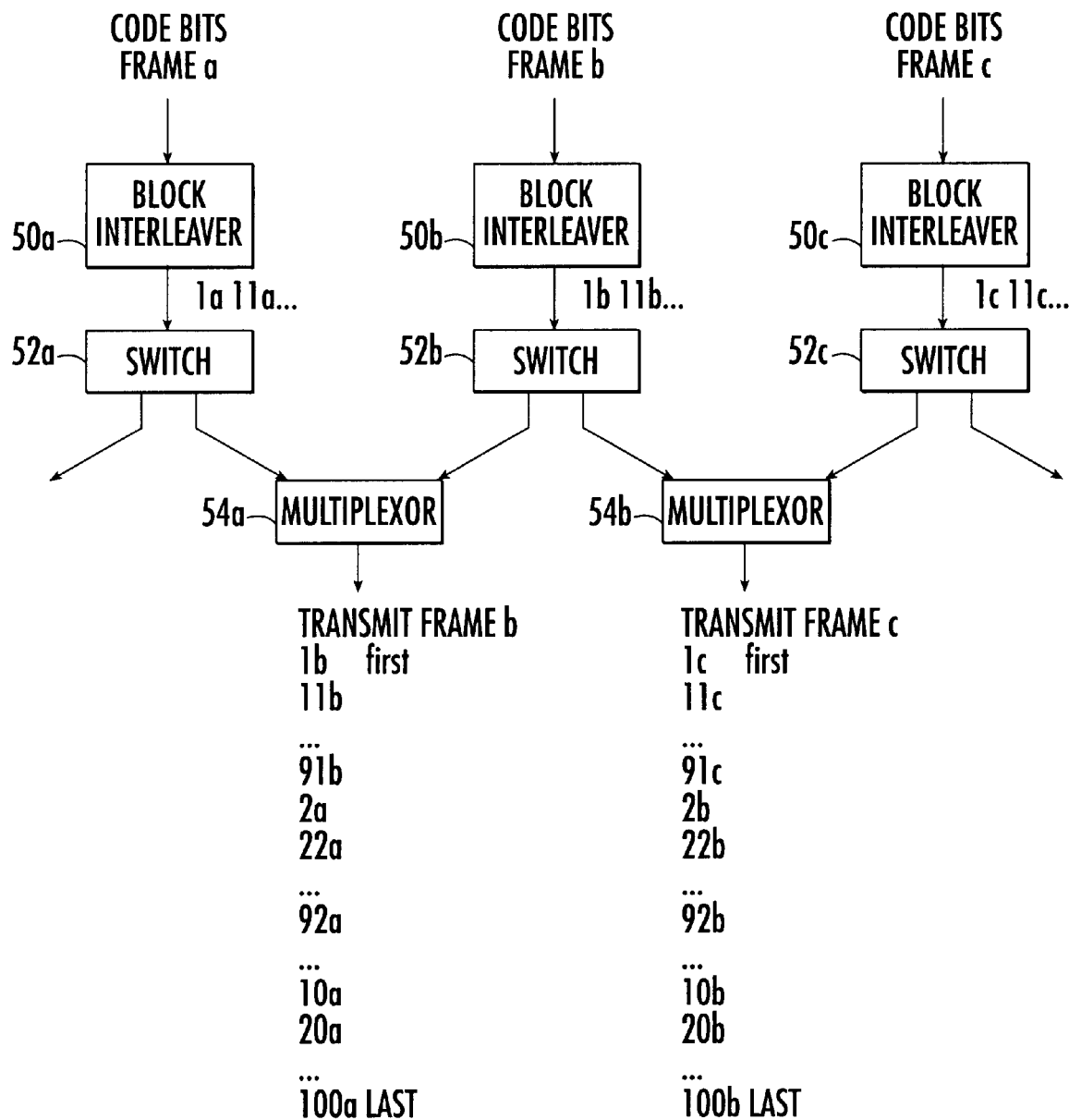
FIG. 4 is a block diagram illustrating an exemplary conventional diagonal interleaving circuit.
Figure 5A:
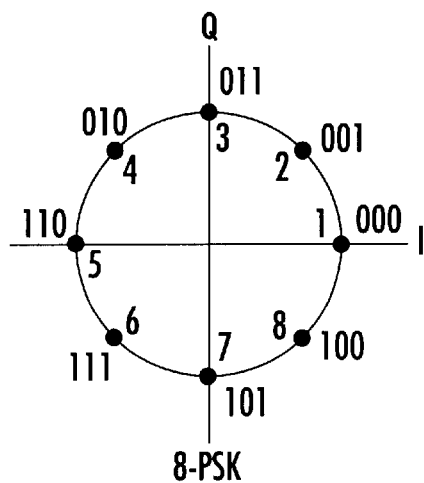
FIG. 5A is a graphical illustration of an 8-PSK modulation constellation.
Figure 5B:
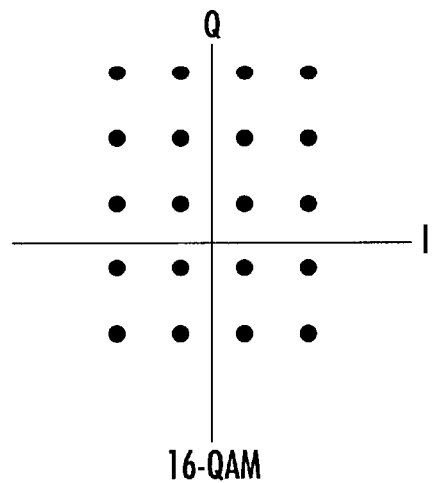
FIG. 5B is a graphical illustration of a 16-QAM modulation constellation.
Figure 6:
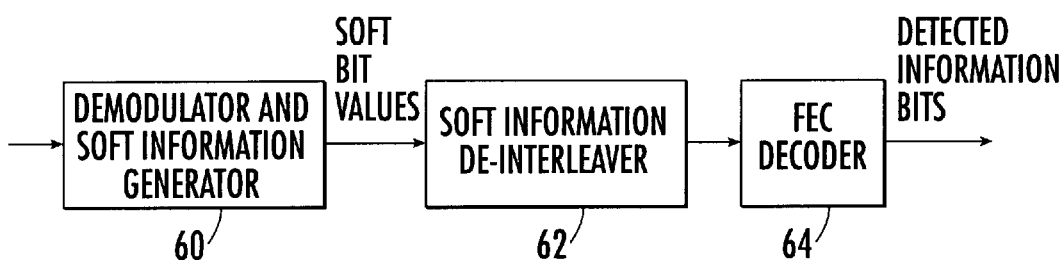
FIG. 6 is a block diagram illustrating a conventional baseband processor.
Figure 7:
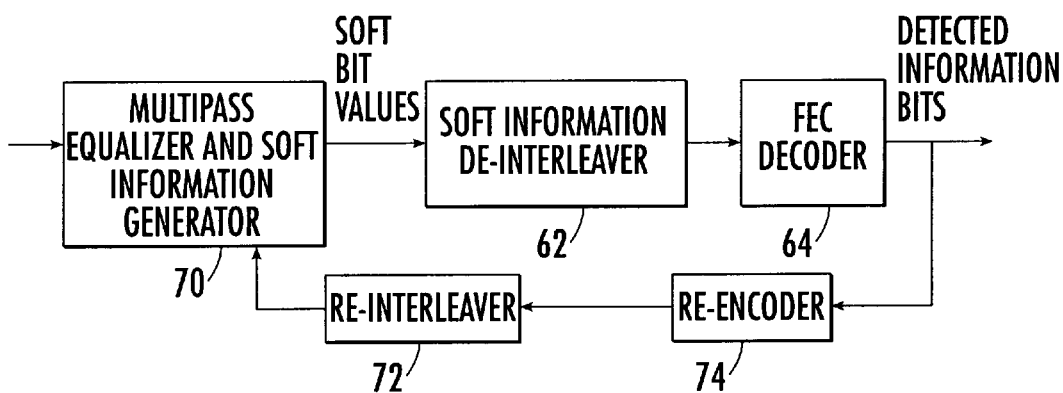
FIG. 7 is a block diagram illustrating a conventional multipass baseband processor.
Figure 8:
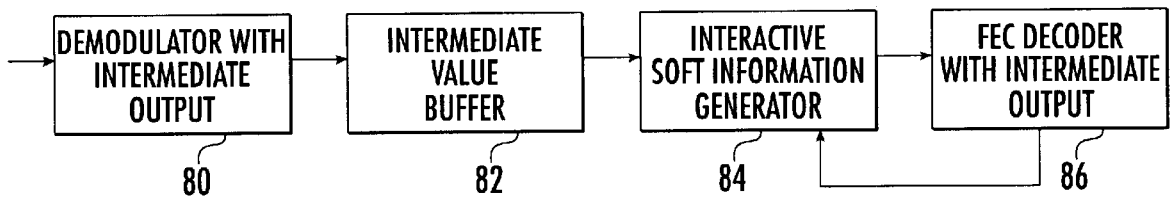
FIG. 8 is a block diagram illustrating an embodiment of a baseband processor according to the present invention.

Single pass embodiments of a baseband processor according to the present invention are illustrated in FIG. 8. As will be described, the baseband processor of FIG. 8 utilizes the coupling of bit likelihoods in the decoding process. The coupling may be accounted for in generating conditional soft information, conditioned on results from the decoding process so far. By way of background to further understand bit coupling, consider an example, based on the interleaving shown in FIG. 3, in which bits 1, 11, and 21 are transmitted as one 8-PSK symbol, according to the Gray mapping given in FIG. 5A. Note how the symbols in FIG. 5A are numbered 1 through 8. The notation $S_n$ will be used to refer to the nth possible symbol value. Let bit 1 be the left-most bit, bit 11 the middle bit, and bit 21 the right-most bit in FIG. 5A. Let the baseband received signal sample corresponding to this 8-PSK symbol be modeled as:

$$r = cs + n \tag{1}$$

where c is a complex channel coefficient, modeling the amplitude and phase change induced by the transmission medium, s is the transmitted 8-PSK symbol, and n is noise with variance $\sigma^2$ on the in-phase and quadrature components.

With conventional soft information generation, the loglikelihood for the left-most bit would typically be generated by partitioning the possible 8-PSK symbols into two groups, those that correspond to the bit being a 0 and those that correspond to the bit being a 1. The bit loglikelihood is then the difference between the loglikelihood of the symbol being in one group versus the other group. Specifically, for the left-most bit, $$\hat{b}_1 = \log[P(b_1=0)] - \log[P(b_1=1)] \tag{2}$$

where $$P(b_1 = 0) = K\left[\exp\left(\frac{|r - cS_1|^2}{2\sigma^2}\right) + \exp\left(\frac{|r - cS_2|^2}{2\sigma^2}\right) + \exp\left(\frac{|r - cS_3|^2}{2\sigma^2}\right) + \exp\left(\frac{|r - cS_4|^2}{2\sigma^2}\right)\right] \tag{3}$$

$$P(b_1 = 1) = K\left[\exp\left(\frac{|r - cS_5|^2}{2\sigma^2}\right) + \exp\left(\frac{|r - cS_6|^2}{2\sigma^2}\right) + \exp\left(\frac{|r - cS_7|^2}{2\sigma^2}\right) + \exp\left(\frac{|r - cS_8|^2}{2\sigma^2}\right)\right] \tag{4}$$

and K is a constant that can be dropped. When K is dropped, each exponential may be referred to as a pseudo-likelihood. The terms inside the "exp" operation are referred to as loglikelihoods, even though log(K) has not been added. In general, $$\hat{b}_k = \log[P(b_k=0)] - \log[P(b_k=1)] \tag{5}$$

For the other two bits, $$P(b_{11} = 0) = K\left[\exp\left(\frac{|r - cS_1|^2}{2\sigma^2}\right) + \exp\left(\frac{|r - cS_2|^2}{2\sigma^2}\right) + \exp\left(\frac{|r - cS_7|^2}{2\sigma^2}\right) + \exp\left(\frac{|r - cS_8|^2}{2\sigma^2}\right)\right] \tag{6}$$

$$P(b_{11} = 1) = K\left[\exp\left(\frac{|r - cS_3|^2}{2\sigma^2}\right) + \exp\left(\frac{|r - cS_4|^2}{2\sigma^2}\right) + \exp\left(\frac{|r - cS_5|^2}{2\sigma^2}\right) + \exp\left(\frac{|r - cS_6|^2}{2\sigma^2}\right)\right] \tag{7}$$

$$P(b_{21} = 0) = K\left[\exp\left(\frac{|r - cS_1|^2}{2\sigma^2}\right) + \exp\left(\frac{|r - cS_4|^2}{2\sigma^2}\right) + \exp\left(\frac{|r - cS_5|^2}{2\sigma^2}\right) + \exp\left(\frac{|r - cS_8|^2}{2\sigma^2}\right)\right] \tag{8}$$

$$P(b_{21} = 1) = K\left[\exp\left(\frac{|r - cS_2|^2}{2\sigma^2}\right) + \exp\left(\frac{|r - cS_3|^2}{2\sigma^2}\right) + \exp\left(\frac{|r - cS_6|^2}{2\sigma^2}\right) + \exp\left(\frac{|r - cS_7|^2}{2\sigma^2}\right)\right] \tag{9}$$

There are a variety of known ways to approximate these expressions. One frequently used approach is to keep only the dominant term in each probability expression, so that the final loglikelihood is the difference of two dominant loglikelihoods (associated with the two possible bit states).

As shown by these equations, one received value (or symbol), r, is used to generate three soft information bit values, which are conventionally treated as being independent in the decoder. By contrast, the present invention may account for bit coupling such as the coupling between bit likelihoods. For example, the first bit to enter the decoder, $b_1$, may be treated the same way as the conventional approach. Thus, the soft value may be computed as described above.

The decoder may then begin decoding, processing bits 1 through 10. When the decoder needs a soft input for bit 11, information from what the decoder has done so far may be utilized in generating a soft value for bit 11. In this example, the decoder has learned something about bit 1, which it has already processed. Preferably, it has determined a likelihood associated with bit 1. For example, it may have computed the probability that bit 1 is a 0, denoted $p_1$. Then, the probability that bit 1 is a 1 would be $1-p_1$.

This information can be used when generating the soft value for bit 11, for example, by weighting the symbol likelihoods accordingly. Thus, the adjusted likelihoods for bit 11 would be given by:

$$P(b_{11} = 0) = K\left[\begin{array}{l} p_1\exp\left(\frac{|r - cS_1|^2}{2\sigma^2}\right) + p_1\exp\left(\frac{|r - cS_2|^2}{2\sigma^2}\right) + \\ (1-p_1)\exp\left(\frac{|r - cS_7|^2}{2\sigma^2}\right) + (1-p_1)\exp\left(\frac{|r - cS_8|^2}{2\sigma^2}\right) \end{array}\right] \tag{10}$$

$$P(b_{11} = 1) = K\left[\begin{array}{l} p_1\exp\left(\frac{|r - cS_3|^2}{2\sigma^2}\right) + p_1\exp\left(\frac{|r - cS_4|^2}{2\sigma^2}\right) + \\ (1-p_1)\exp\left(\frac{|r - cS_5|^2}{2\sigma^2}\right) + (1-p_1)\exp\left(\frac{|r - cS_6|^2}{2\sigma^2}\right) \end{array}\right] \tag{11}$$

These probabilities may be used to produce a soft value for the decoder using equation (5). Note that this soft value is, therefore, preferably not computed until the decoder had performed part of the decoding process. Similarly, when it is time to process bit 21 in the decoder, the system has learned something about bits 1 and 11. This can be used to bias the symbol likelihoods in a similar manner.

It is known in the art that an FEC decoder may produce intermediate information regarding the likelihood of already processed code bits. Preferably, for the case of convolutional encoding or Turbo encoding, the decoder is a fixed-lag MAP decoder, which can be used to produce likelihoods associated with code bits based on partially processed received data. To reduce complexity, an MLSE decoder using some form of the soft output Viterbi algorithm (SOVA) can also be used. For block codes, soft decoding based on a trellis can be used. Other suitable types of FEC decoders will be known to those of skill in the art.

Based on experience with Turbo codes, it is preferred that the coded bit likelihood normally produced by the decoder be adjusted to produce extrinsic information. With extrinsic information, the gain in information from before decoding to after processing a bit in the decoder, may be produced. This may be realized by taking the loglikelihood of the bit after decoding and subtracting the loglikelihood of the bit before decoding (based on the soft value into the decoder).

To reduce complexity in computing the adjusted (biased) soft information, hard decisions regarding previously processed bits may be used. In this case $p_1$ would be either 0 or 1. As a result, the two bit likelihood expressions for $b_{11}$ would each sum 2 values instead of 4. For bit 21, there would be only one term in each expression. For this case, the soft value could be more simply computed as a difference of loglikelihoods associated with these two terms.

The baseband processor according to an embodiment of the present invention illustrated in FIG. 8 will now be further described. The received baseband signal is provided to a demodulator 80 which, in the illustrated embodiment, includes an intermediate output unit which produces intermediate demodulator output information. For example, for 8-PSK, it may produce 8 symbol loglikelihoods of the form:

$$P(s = S_k) = \frac{|r - cS_k|^2}{2\sigma^2} \quad (12)$$

By expanding the square and dropping unessential terms, it may also produce symbol likelihoods of the form:

$$P(s = S_k) = \frac{s^* c^* r}{2\sigma^2} \quad (13)$$

where superscript "*" denotes a complex conjugate.

As shown in FIG. 8, these symbol loglikelihoods are provided to a memory 82 such as intermediate value buffer configured to store the values and provide them, as needed, to an interactive soft information generator circuit (ISIG) 84. The ISIG 84 provides soft bit values to the FEC decoder 86 which, for the embodiment illustrated in FIG. 8, includes an intermediate output unit, for decoding. Thus, the ISIG may compute soft values in the order corresponding to the output of the encoder at the transmitter, effectively performing the de-interleaving function as well. The ISIG 84 in the illustrated embodiment is configured to generate soft information associated with the plurality of bits in the received signal based on a coupling of at least one of the plurality of bits to another of the plurality of bits introduced by at least one of the channel or the transmitter (as described generally above for the case of a higher order modulation scheme induced coupling from the transmitter) and responsive to the demodulator soft information associated with the plurality of bits such as the symbol loglikelihoods output from the demodulator 80 through the memory 82.

Many variations on what intermediate quantities are stored as the demodulator soft information may be utilized with the present invention. For example, the quantity $$x = \frac{c^* r}{2\sigma^2} \quad (14)$$

could be stored and used as part of the ISIG function to determine symbol loglikelihoods.

As described previously, the FEC decoder 86 may produce likelihood information associated with previously processed code bits using conventional approaches. The ISIG 84 may operate in the case of a higher order modulation scheme, such as 8-PSK, coupling by storing the intermediate decoder information provided by the FEC decoder 86. When generating a soft bit value for a bit corresponding to a particular symbol, the ISIG 84 may check the intermediate decoder information to see if information regarding other bits in that symbol were present. If not, it may generate a soft value in a conventional manner. If such information is available, however, the ISIG 84 may use this coupled bit information to bias the soft value.

Figure 9:
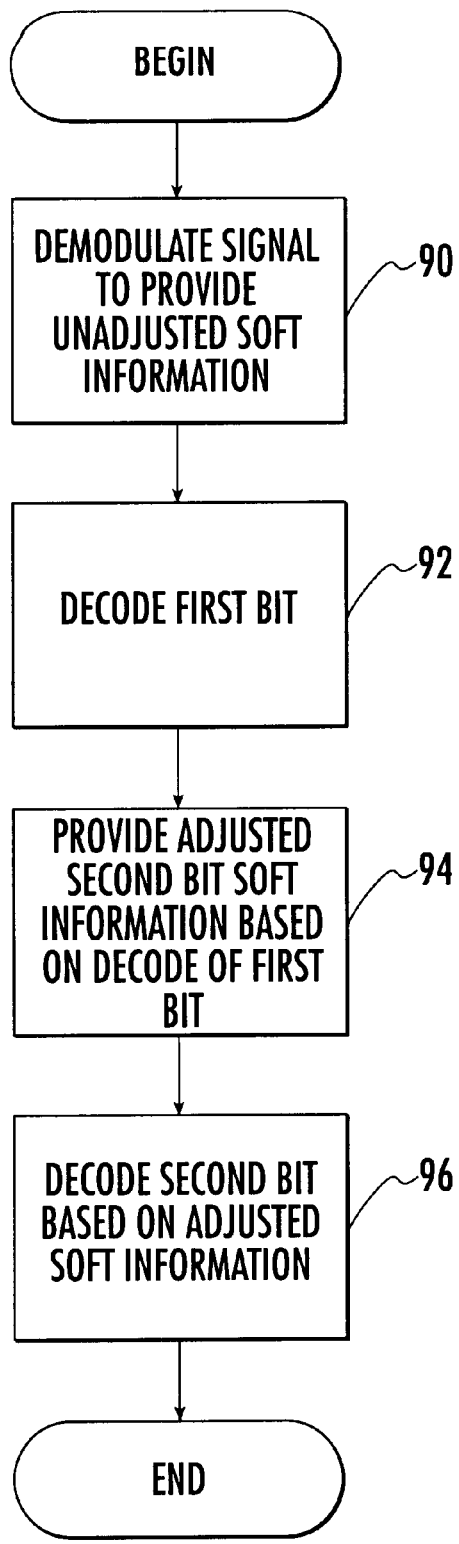
FIG. 9 is a flowchart illustrating baseband processing operations according to an embodiment of the present invention.

Operations for a single pass baseband processor according to an embodiment of the present invention for decoding a signal received over a channel from a transmitter will now be more generally described with reference to FIG. 9. Operations for decoding a received signal having a first bit and a second bit based on a coupling of the first bit to the second bit introduced by at least one of the channel or the transmitter begin at block 90 with the received signal being demodulated to provide unadjusted soft information associated with the first bit. The received signal is forward error correction decoded based on the provided unadjusted soft information associated with the first bit (block 92). More particularly, at block 92, the first bit is decoded based on the unadjusted soft information associated with the first bit. Soft information associated with the second bit based on the forward error correction decoding of the first bit and the coupling of the second bit to the first bit is used to provide adjusted soft information associated with the second bit (block 94). The soft information may be path independent information. As used herein, "path independent soft information" refers to soft information that does not depend on a path or state of the decoder. The second bit is forward error correction decoded based on the adjusted soft information associated with the second bit (block 96).

Figure 10:
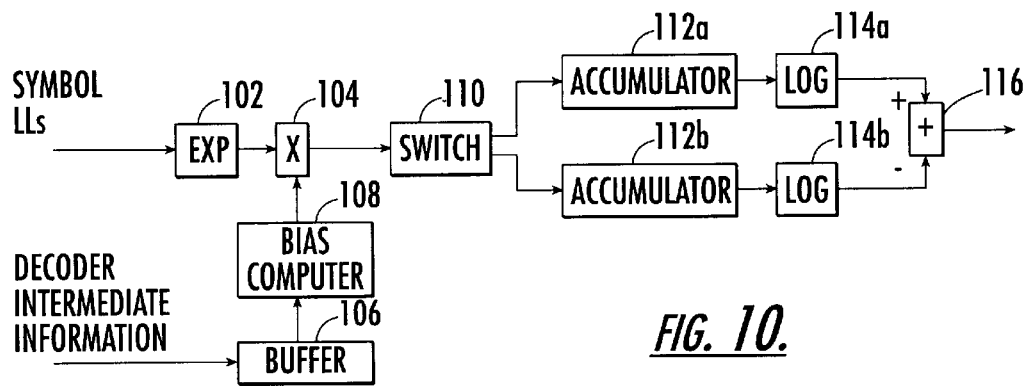
FIG. 10 is a block diagram illustrating an embodiment of a soft information generation circuit according to the present invention.
Figure 11:
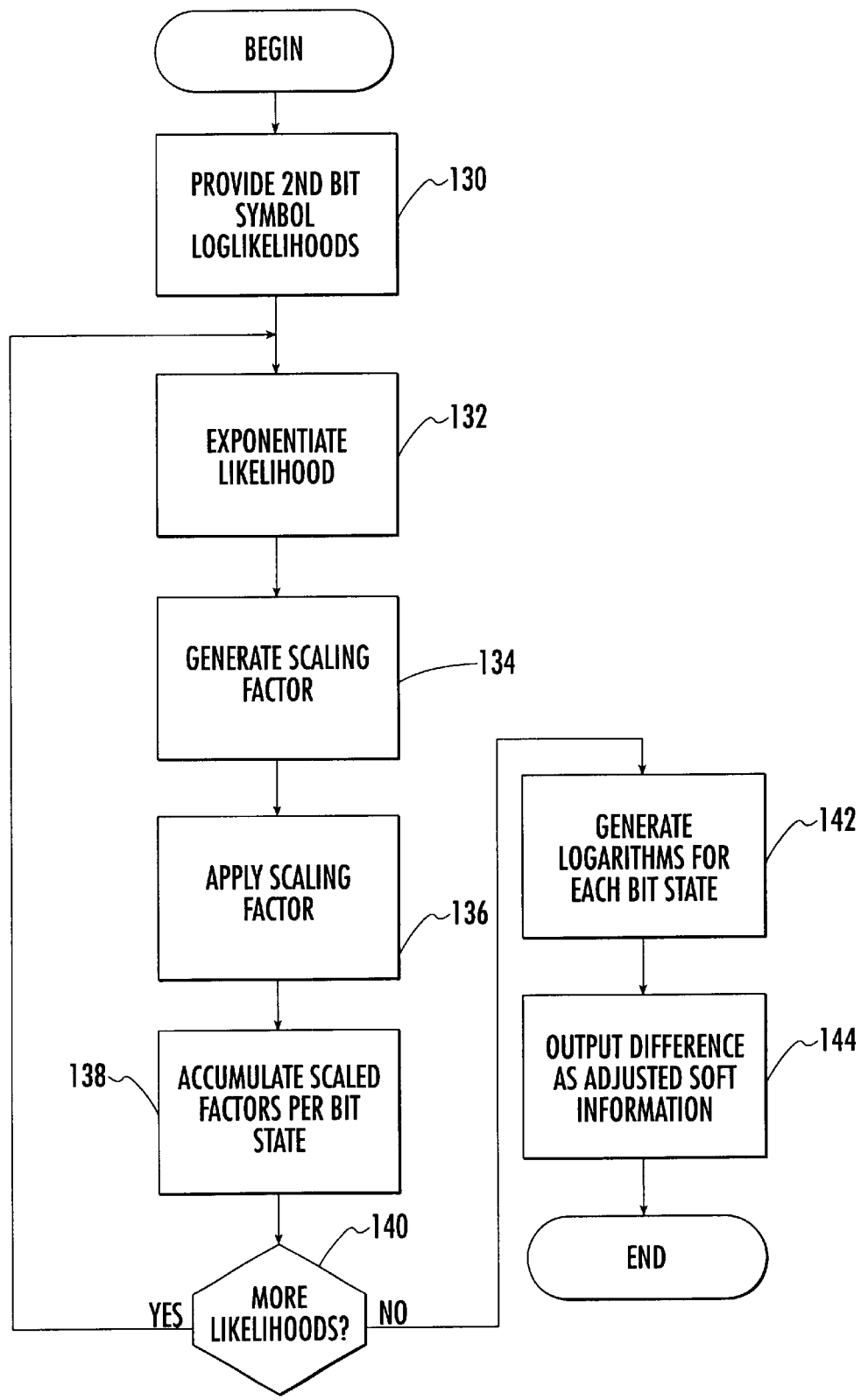
FIG. 11 is a flowchart illustrating soft information generation according to an embodiment of the present invention.

An embodiment of an ISIG based on MAP soft information generation according to a further aspect of the present invention is illustrated in FIG. 10 with operations for this embodiment further illustrated in the flowchart of FIG. 11. For a particular bit (referred to in FIG. 11 as the second bit) in an 8-PSK example, the 8 symbol loglikelihoods (LLs) corresponding to the 8-PSK symbol are provided to the ISIG (block 130). Each symbol is exponentiated in exponentiation circuit 102 (block 132). Based on decoder intermediate information (such as the unadjusted soft information associated with the first bit coupled to the second bit) stored in the buffer memory 106, a bias computer 108 generates scaling factors for the plurality of symbol loglikelihoods (block 134). The scaling factors are used by the multiplier 104 to scale the exponentiated symbol loglikelihoods (block 136). Thus, the bias computer 108 and the multiplier 104 provide a scaling circuit that scales the exponentiated soft information responsive to the decoder soft information associated with ones of a plurality of bits in the received signal. Based on the example above, the bias computer 108 may produce a term $p_1$ or $1-p_1$. If there is not information available in the buffer 106, the multiplier 104 could be by-passed or the bias computer 108 could output a constant value, such as 1 or ½.

The scaled value out of the multiplier 104 is provided to a switch 110, which switches the scaled value to an accumulation circuit including two accumulators, 112a and 112b, with the accumulator selected by the switch 110 depending on whether the symbol corresponds to the (second) bit being a 1 or a 0 (block 138). After all 8 symbol loglikelihoods (LLs) have been thus processed (block 140), the outputs of the accumulators 112a and 112b are provided to a combiner circuit including the log circuits 114a and 114b and a summer 116. The log circuits 114a, 114b output the logarithmic value of their inputs from the accumulators 112a, 112b (block 142). The difference between the outputs of the log circuits 114a, 114b is determined by the summer 116, which produces the soft information output for the bits in the received signal by processing in the manner described (block 144).

Figure 12:
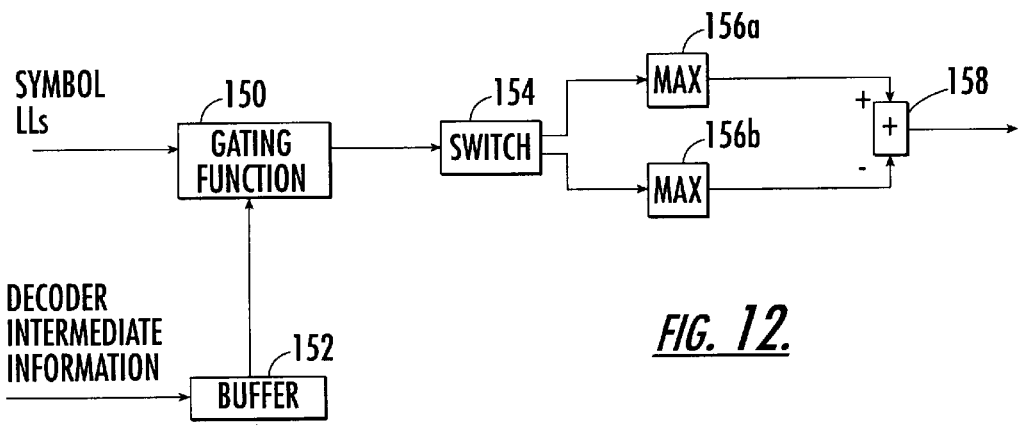
FIG. 12 is a block diagram illustrating an embodiment of a soft information generation circuit according to the present invention.
Figure 13:
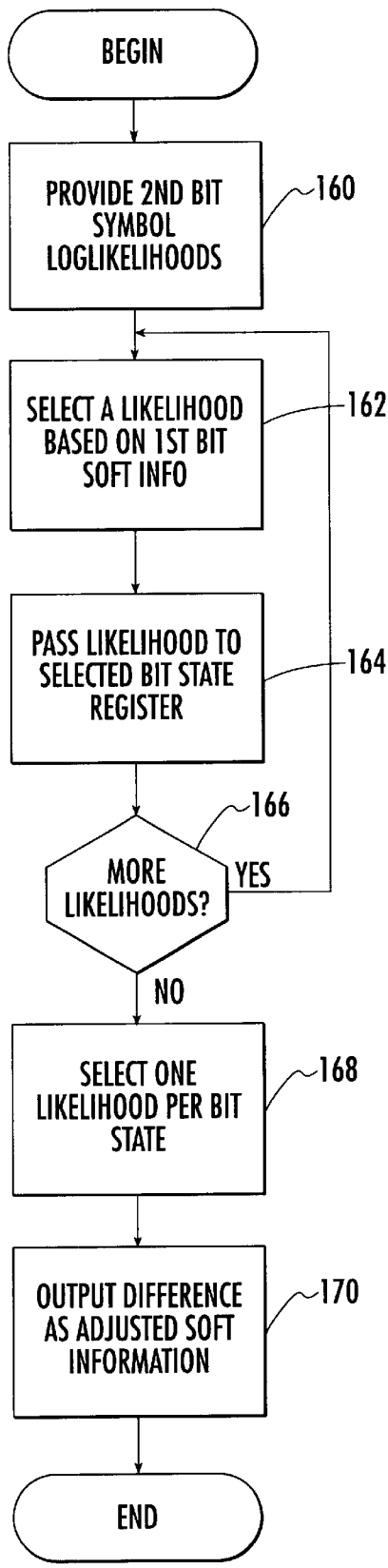
FIG. 13 is a flowchart illustrating soft information generation operations according to an embodiment of the present invention.

An alternative embodiment of an ISIG based on selectively keeping dominant terms, such as only keeping dominant terms, is illustrated in FIG. 12 with operations for this embodiment further illustrated in the flowchart of FIG. 13. Again, an 8-PSK modulation scheme will be assumed for purposes of simplifying the description herein. For a particular bit (referred to in FIG. 13 as the second bit), the 8 symbol loglikelihoods (LLs) corresponding to the 8-PSK symbol are provided to the ISIG, more particularly, to the gating circuit 150 which, using the buffer 152, may be configured to output demodulator soft information associated with bits in the received signal responsive to decoder generated soft information associated with the bits so as to selectively output demodulator soft information associated with symbol states indicated by the soft information associated with the bits (block 160). In the illustrated embodiment, the gating circuit 150 (block 162) either passes the selected symbol loglikelihoods to its output or not, depending on intermediate decoder soft information stored in the buffer 152 (block 164). If the buffer 152 contains no information regarding that symbol, then the gating circuit 150 preferably passes all 8 LLs at block 164. However, if the buffer 152 has information regarding detected values for 1 or more of the bits in the symbol, it may only pass symbol LLs that corresponded to the detected bit values. The passed values from the gating circuit 150 are provided to the switch 154 which may operate in a manner similar to that described with reference to the switch 110 in the embodiment of FIG. 10. The outputs of the switch 154 are provided to a selected one of the selection circuits 156a, 156b which, for the illustrated embodiment, are maximum selection units based on soft information having a maximum value associated with a higher confidence level. The selection circuits 156a, 156b with the switch 154 thereby provide a best value selection circuit with each selection circuit 156a, 156b storing a best demodulator soft information output associated with each of a first and second bit state (such as 0 and 1 as described herein) in an associated register. As used herein a "best" is a strongest or highest confidence which may be either a maximum or a minimum depending on the manner in which soft information values are generated. For example, as described herein with a maximum selection unit, the selection circuits 156a, 156b output the largest of their inputs. However, depending on how the LLs are stored, the smallest value may need to be computed instead as noted above.

After all 8 symbol LLs have been processed (block 166), the largest values from the selection circuits 156a, 156b are provided to a combiner circuit 158 (an adder (summer) in the illustrated embodiment) (block 168) which computes their difference as the soft information associated with the respective processed bits (block 170).

Figure 14:
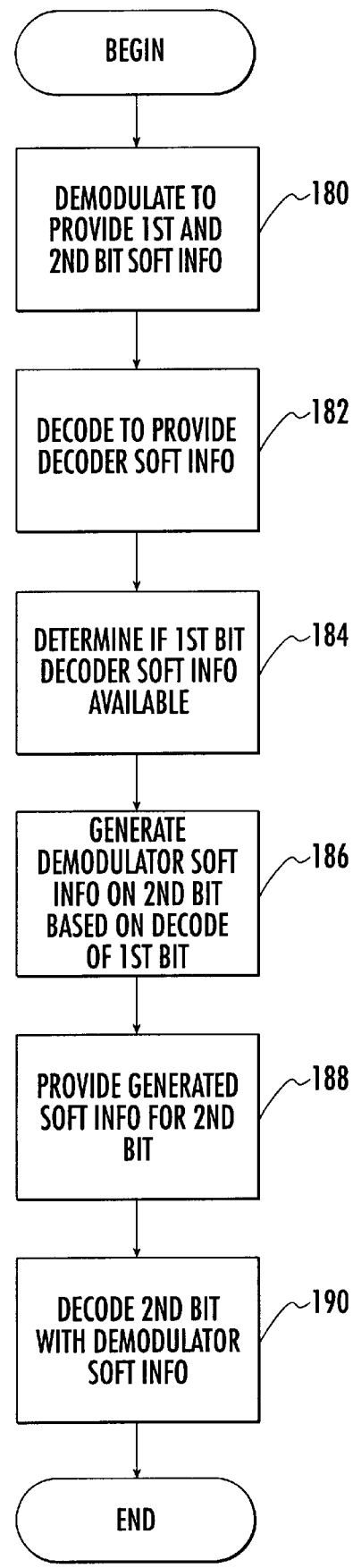
FIG. 14 is a flowchart illustrating baseband processing operations according to an embodiment of the present invention.

Operations according to a further embodiment of the present invention will now be described with reference to FIG. 14. For the embodiment of FIG. 14, the coupling of the first bit to the second bit is introduced by a modulation scheme used at the transmitter to generate a symbol for transmission including the first bit and the second bit. Operations begin at block 180 with the received signal being demodulated to provide demodulator intermediate soft values associated with the first bit and the second bit. The received signal is decoded to provide decoder intermediate soft value information for the first bit when a sufficient set of demodulated signal information is available (block 182). It is, therefore, determined whether the decoder intermediate soft value information for the first bit is available (block 184). An output demodulator soft value associated with the second bit based on the decoder intermediate soft value information for the first bit and the demodulator intermediate soft value associated with the second bit is generated (block 186) and provided (block 188) if the decoder intermediate soft value information for the first bit is available. The demodulator intermediate soft value associated with the second bit is provided as the output demodulator soft value associated with the second bit if the decoder intermediate soft value information for the first bit is not available (block 188). The received signal is decoded based on the output demodulator soft value associated with the second bit (block 190).

Figure 15:
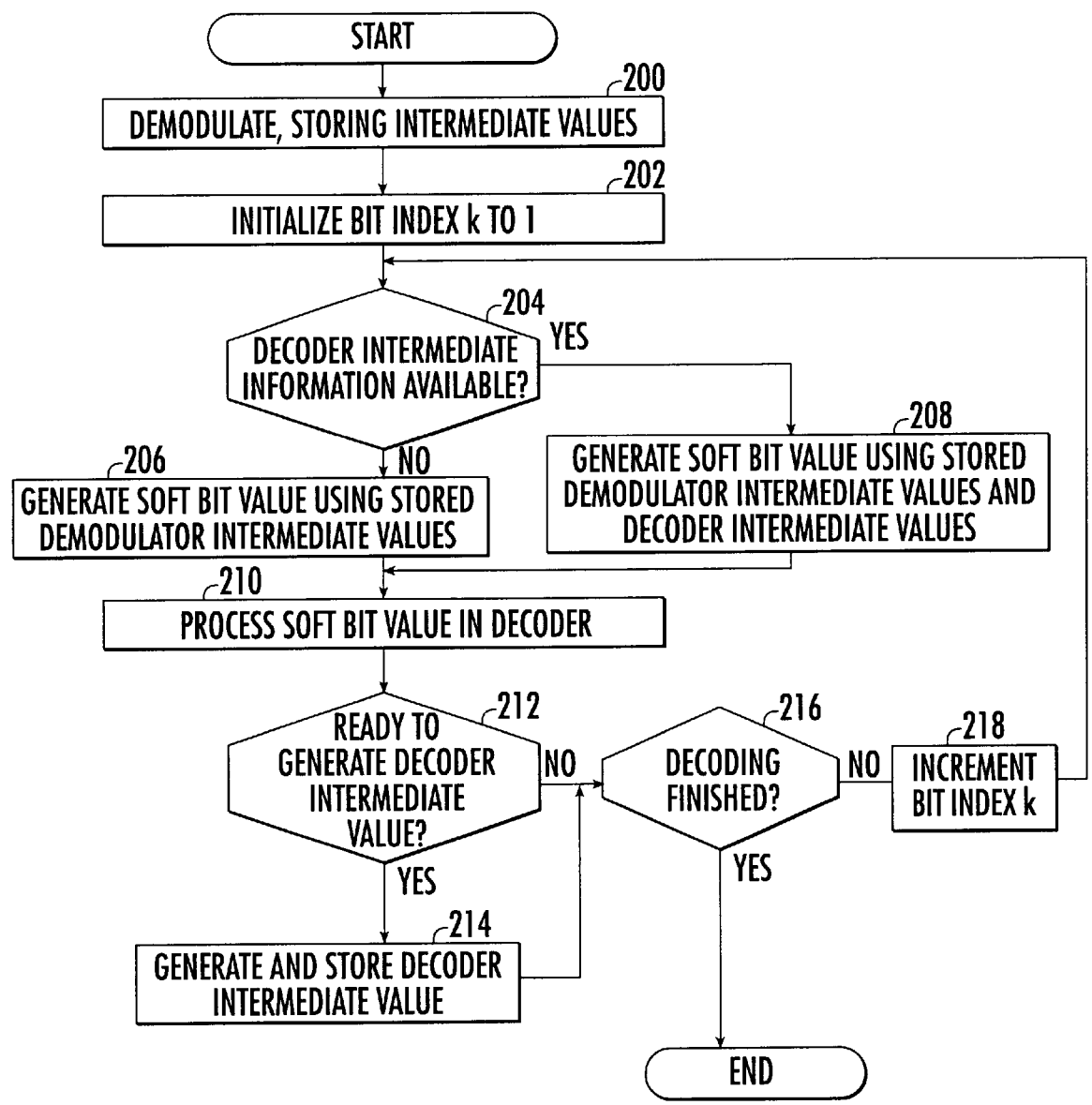
FIG. 15 is a flowchart illustrating baseband processing operations according to an embodiment of the present invention.

Operations according to a further embodiment of the present invention will now be described with reference to the flow diagram of FIG. 15. Operations begin at block 200 as the received signal is demodulated and intermediate values, such as symbol loglikelihoods, are stored. Decoding and interactive soft information generation begins at block 202 by initializing the bit index k. At block 204, it is determined if the decoder has provided intermediate information regarding other bits that share the same symbol as bit k. If not, the demodulator intermediate values are used in the conventional way to generate a soft value for bit k (block 206). Otherwise, the decoder intermediate information is used together with the demodulator intermediate information to generate a soft value for bit k (block 208). The soft bit value in either case is processed by the decoder in the conventional way (block 210). It is then determined whether the decoder is ready to generate an intermediate value or set of information (block 212). Typically, the decoder processes the first few bits before it is ready to generate intermediate information on the first bit. If the decoder is ready, then an intermediate value is generated and stored (block 214). It is then determined whether decoding is finished (block 216). If decoding is finished, the process ends. Otherwise, the bit index k is incremented (block 218) and operations return to block 204.

In practice, there are typically only a finite number of interleaving patterns. Thus, operations at block 204 could be, for example, implemented with a lookup table, based on the bit index k. Alternatively, operations at block 204 could be eliminated, for example, by having only one memory for soft information. In this case, operations at block 200 may include initially writing soft values into this memory. Operations at block 214 would then overwrite these values.

The present invention may also be implemented utilizing a multipass decoding approach. Intermediate soft information from the demodulation process may be used to create different soft information values with each pass of the decoder. In various multipass decoding embodiments, the first pass essentially corresponds to traditional processing. Then, for the second pass, some or all of the soft information bit values may be adjusted based on soft information on the other coupled bits, such as bits that share the same 8-PSK symbol. With reference to the 8-PSK terminology introduced previously, for example, bit 1's soft information value on the second pass may be biased by information regarding bits 11 and 21. Similarly, bit 11 may be biased by information regarding bits 1 and 21 and bit 21 may be biased by information regarding bits 1 and 11. By using extrinsic information, i.e., a difference of input and output bit log-likelihood ratios, the passes should converge. The multipass process may optionally be repeated a selected fixed number of times, or an adaptive number of times until a criteria is satisfied for terminating decoding operations. For example, it could be repeated until either an error detection code (e.g., cyclical redundancy check (CRC)) checks or until a maximum number of passes is performed.

Figure 16:
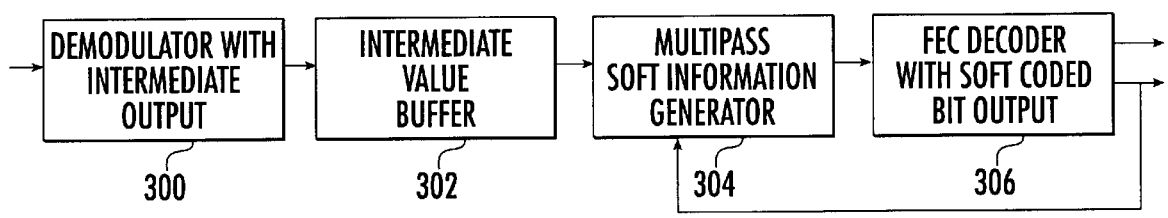
FIG. 16 is a block diagram illustrating an embodiment of a baseband processor according to the present invention.
Figure 17:
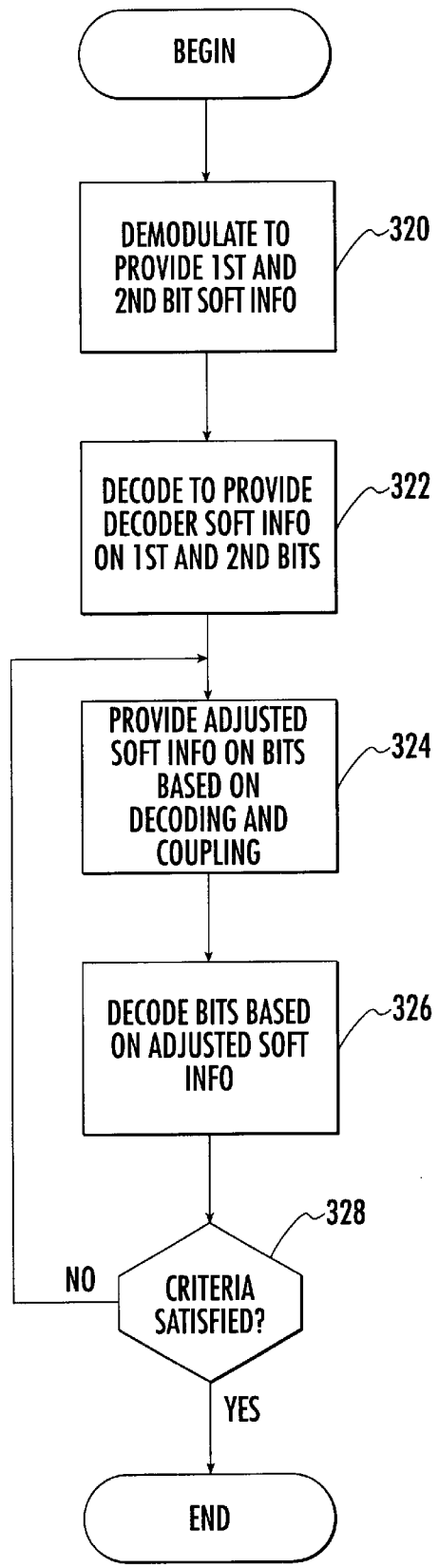
FIG. 17 is a flowchart illustrating baseband processing operations according to an embodiment of the present invention.

An embodiment of a multipass decoding baseband processor according to the present invention is illustrated in FIG. 16 with operations for this embodiment further illustrated in the flowchart of FIG. 17. A demodulator 300 which, in the illustrated embodiment includes intermediate output, provides intermediate values which may be stored in buffer memory 302 (block 320). For the first pass, the multipass soft information generator circuit 304 may produce soft information using conventional approaches. These soft values may be provided to an FEC decoder 306 which, in the illustrated embodiment, includes soft code bit output. The decoder 306 performs decoding based on the unadjusted soft information associated with bits in the received signal from the demodulator 300 and also produces decoder soft information such as soft information bit values (block 322). These values may be fed back to the multipass soft information generator circuit 304, which may use these values, together with the intermediate demodulation soft information values, to produce adjusted soft information values for a second round of decoding (block 324). In other words, as described in FIG. 17 with reference to a first bit and a second bit coupled thereto, the adjusted soft information associated with the second bit may be based on the forward error correction decoding of the first bit in the first pass and the adjusted soft information associated with the first bit may be based on the forward error correction decoding of the second bit in the first pass. The received signal is then decoded using the adjusted soft information in the subsequent pass (block 326) Third and further decoding passes may also be performed in a similar manner, for example, until a performance or other criteria is satisfied (block 328).

For the described multipass embodiment, the decoder 306 may process all soft values in one pass before producing decoder code bit information such as decoder soft information. Thus, decoders which generally require processing of all data, such as MAP decoders, may be used.

Ideally, soft information associated with coupled bits should be processed by the decoder together. For example, with reference to an 8-PSK embodiment, there are essentially a finite number of possible information sequences. Each possible sequence corresponds to a possible sequence of 8-PSK symbols. Thus, for each sequence, one could form a likelihood using 8-PSK symbol likelihoods directly. This could be used to account for the coupling of the bits due to the 8-PSK modulation. However, this approach may not be desirable as it may be highly complex. However, a tree-based decoding scheme may be beneficially used, such as a path-based method with pruning, for example, based on the well known M-algorithm.

In such an embodiment, the decoder may keep metrics as soft information during processing associated with the M best sequences so far. At the end of the decoding process, the sequence with the best metric may be selected as the detected sequence. For the 8-PSK example above, the soft value for $b_1$ may be produced the conventional way. For $b_{11}$, the soft value may then depend on the path history of a particular path. For the M paths, suppose M/2 of them have $b_1=0$ and the other M/2 have $b_1=1$. Then, two biased soft values for $b_{11}$ may be generated, one biased for $b_1.=0$ and used with those corresponding paths and one biased for $b_1=1$ and used with the other set of paths. A similar process may occur for $b_{21}$, only there may be up to 4 possible biased values based on $b_1$ and $b_{11}$ states.

Note that how the soft information value is biased in this embodiment depends on the path history. This can be viewed as a new type of Per-Survivor-Processing (PSP). As will be known to those of skill in the art PSP is conventionally used, for example, for channel tracking in adaptive equalization.

Figure 18:
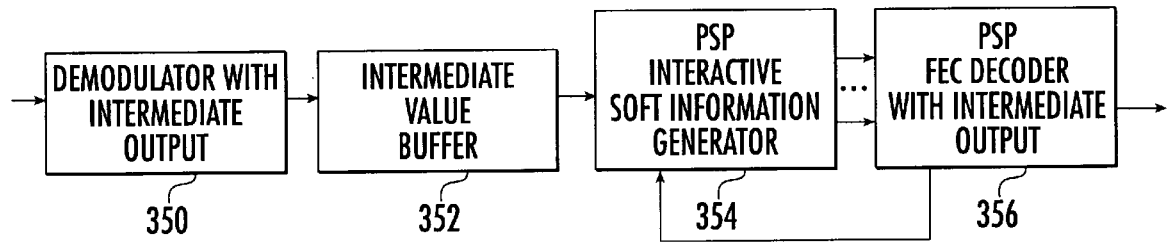
FIG. 18 is a block diagram illustrating an embodiment of a baseband processor according to the present invention.

A PSP decoding embodiment of a baseband processor according to the present invention is illustrated in FIG. 18. A demodulator 350 which, in the illustrated embodiment, includes an intermediate output, provides intermediate demodulator soft information values which may be stored in a buffer memory 352. A PSP interactive soft information generator circuit 354 may produce soft information for each path based on the path history. Accordingly, the soft information produced by the soft information generator circuit 354 is not path independent. For the first several bits processed, information regarding other coupled bits is typically not available in the path history and conventional soft information generation may be used. In other words, the same soft information values may be used for all paths in the decoder 356. However, once information is available regarding bits that are coupled to the bit being processed, this information may be used to produce path dependent demodulator soft information values from the demodulator 350 through the buffer 352 and the soft information generator circuit 354. These adjusted soft information values may be provided to the decoder 356. Stated from the perspective of a first bit and a second coupled bit, first state soft information associated with the second bit is provided based on a first state path history for the first bit and second state soft information associated with the second bit is provided based on a second state path history for the first bit. The second bit is forward error correction decoded based on processing soft information to produce path metrics.

In particular applications of the present invention, it may be desirable to pre-compute the adjusted soft information values when the adjustments can take only certain values (e.g. hard values). Thus, the soft information generator circuit may pre-compute the possible adjusted soft values and read out (utilize) the appropriate one based on feedback from the decoder. For this embodiment, a slightly different architecture of the baseband processor is preferable, in which the demodulator (such as a coherent detector or an equalizer) has the added task of computing all possible conditional soft information values. Thus, for the 8-PSK case, for each bit, the demodulator would compute the normal, unconditional soft value, two soft information values conditioned on 1 of the other two bits, two soft information values conditioned on the other of the two bits, and four soft information values conditioned on both other bits. Therefore, instead of the conventional one soft information value, the demodulator may provide 9 soft information values, 8 of which are conditional soft information values. Then, the decoder may select which pre-computed soft information value to use based on the detected bit values.

Note that, while the present invention has generally been described with respect to coherent demodulation of 8-PSK symbols in a non-inter-symbol interference (ISI) channel, it is to be understood that the present invention is not so limited and may be utilized with other modulation schemes and other forms of coupling between bits. For example, ISI from pulse shaping or multipath dispersion can couple bits. This may occur, for example, in the GSM and Enhanced Data rates for Global Evolution (EDGE) radiotelephone systems. For such an application, the demodulator may be an equalizer. For MLSE-based equalization, equalization path metrics may be stored and used later to derive soft information.

Thus, the notation of "symbol" can be extended to indicate bits that are coupled. For example, a "symbol" can be a pair of modulation symbols. For example, if 8-PSK symbols are numbered 1, 2, 3, etc., then symbols that indicate a bit coupling, due to partial response or mulitpath dispersion, could be modulation symbol pairs {1,2}, {2,3}, etc. Observe that these symbols can share modulation symbols.

The present invention can also be utilized to determine which path metrics are used or how they are weighted. In this case, coupling may be between successive symbols as well as bits within a symbol. For example, consider decision feedback sequence estimation (DFSE) demodulation for the EDGE system. With this approach, an MLSE-like equalizer is used except the number of states is reduced by using path-dependent decision feedback, similar to a decision feedback equalizer. Consider the case where the demodulator keeps 8 states, corresponding to the 8 previous symbol values. Eight (8) path metrics are associated with these 8 states, related to the likelihood or, preferably, loglikelihood, of the sequence corresponding to the state and its symbol history. At each iteration, each new set of 8 states would have 8 incoming candidate paths, corresponding to the 8 previous states. Preferably, only one of the 8 incoming paths would survive.

When computing soft information with DFSE and MLSE-like equalizers, it is common to use the path metrics in various forms of the soft-output Viterbi algorithm (SOVA). Utilizing the present invention in such an environment, the decoder would have information indicating which paths would be more likely than others. Rather than re-running the equalizer using this information as with conventional multi-pass equalization, just the soft information may be re-computed or computed differently. For example, rather than using all the path metrics when computing soft information, only those that correspond to valid paths may be used. As used herein, valid paths are those that correspond to the detected bit values from partial decoding.

In a further embodiment, only certain demodulation quantities are recomputed. For example, in a MAP or MLSE equalizer, partial decoding information may be used to re-compute branch metrics and path metrics for only one or a few iterations of the equalizer. The temporarily modified metrics may then be used to compute soft information. Specifically, branch metrics are usually computed assuming equi-likely bit values. With partial decoding information, a bias can be added or multiplied (depending on the type of branch metric) to the originally computed branch metric to form a re-computed branch metric.

Another example is the GSM system, which can be modeled as partial response binary phase shift keyed (BPSK). Successive bits in this environment are expected to be coupled due to the modulation as well as multipath time dispersion. As the decoder learns about certain bits, this information can be used in soft information generation for the remaining bits.

Alternatively, equalizer quantities can be used to compute probabilities associated with multiple bits or multiple symbols. For example, with 8-PSK symbols, each of which represents 3 bits, the joint probability of the 6 bits associated with two consecutive 8-PSK symbols can be computed. Basically, with 6 bits, there are 64 possible joint values, each of which would have a probability assigned to it. These joint probabilities can be computed from equalizer or demodulator quantities. For example, for the MAP demodulator given in L. R. Bahl, J. Cocke, F. Jelinek, and J. Ravif, "Optimal Decoding of Linear Codes for Minimizing Symbol Error Rate," IEEE Trans. Inform. Theory, vol. IT-20, pp. 284–287, March 1974, the demodulator uses intermediate quantities denoted as the alphas, betas, and gammas. The alphas, betas, and gammas can be used to extract joint likelihood information about symbols or bits. For the example given, the 64 joint values can be combined to generate individual bit likelihoods (soft values) for any of the 6 bits. The joint values can also be combined to generate likelihoods associated with subsets of the 6 bits.

For the bits initially provided to the decoder, soft information can be computed in the conventional way or by using the joint information. For a bit that is coupled to a decoded bit, partial decoding information regarding the decoded bit can be used, together with the joint information, to compute a soft value. Basically, the partial decoding information is interpreted as an a priori probability (bias) associated with the decoded bit. The bias terms are incorporated when combining the joint values to produce individual bit probabilities or soft information for input to the decoder. This assumes the partial decoding information is soft. The partial decoding information can be hard decision, giving the decoded bit a hard value. In this case, one hard decision value reduces the 64 joint values to 32, and so on.

With regards to FIG. 8, the formation of joint information can be performed within the demodulator with intermediate output 80, so that it is stored in intermediate value buffer 82. Alternatively, the joint information can be computed in interactive soft information generator 84, using information stored in intermediate value buffer 82. Similarly, the formation of joint information can be performed in either the demodulators or the soft information generators in FIGS. 16 and 18.

In a further embodiment of the present invention, bit coupling may be used in decoding of signals with differential modulation. For example, in equalization for IS-136 standard signals, paths may correspond to coherent symbol sequences. Information from the decoder on differential bits can be used to recompute branch metrics, with adjustments (biases), or to eliminate certain paths from soft information generation.

The present invention may also be utilized with code division multiple access (CDMA) systems with direct-sequence spread-spectrum modulation. When a low spreading factor is used, there may be significant coupling between successive symbols. Also, the symbols prior to spreading may be higher-order modulated, such as 8-PSK.

In a further aspect of the present invention, decoding need not start with the first bits that entered the encoder at the transmitter as is conventionally provided. With the present invention, it may be advantageous to start decoding at a different point. For example, certain information bits may have been sent more reliably, due to the fact that the corresponding coded bits were placed near known, synchronization patterns or were given better distance properties in the mapping to modulation symbols. The starting point may also be determined adaptively, for example, based on how large, in magnitude, the soft information values are for the corresponding coded bits. For example, a multipath fade may have made the coded bits corresponding to the first information bits unreliable. Thus, in this aspect of the present invention, it may be desirable to start decoding at a point where the coded bits are highly reliable. Other measures of reliability may also be used, such as equalizer metrics, signal strength, signal to noise ratio (SNR) estimation, and other reliability measures as will be appreciated by those of skill in the art.

Operations of the present invention have been described with respect to the block diagram illustrations of FIGS. 8, 10, 12, 16 and 18 and the flowchart illustrations of FIGS. 9, 11, 13, 14, 15 and 17. It will be understood that each block of the flowchart illustrations and the block diagram illustrations of FIGS. 8 through 18, and combinations of blocks in the flowchart illustrations and the block diagram illustrations, can be implemented by computer program instructions. These program instructions may be provided to a processor to produce a machine, such that the instructions which execute on the processor create means for implementing the functions specified in the flowchart and block diagram block or blocks. The computer program instructions may be executed by a processor to cause a series of operational steps to be performed by the processor to produce a computer implemented process such that the instructions which execute on the processor provide steps for implementing the functions specified in the flowchart and block diagram block or blocks.

Accordingly, blocks of the flowchart illustrations and the block diagrams support combinations of means for performing the specified functions, combinations of steps for performing the specified functions and program instruction means for performing the specified functions. It will also be understood that each block of the flowchart illustrations and block diagrams, and combinations of blocks in the flowchart illustrations and block diagrams, can be implemented by special purpose hardware-based systems which perform the specified functions or steps, or combinations of special purpose hardware and computer instructions. For example the demodulator 80, the soft information generator circuit 84 and the decoder 86 may all be implemented as code executing on a processor, as integrated circuit devices, such as signal processors or custom chips, or as a combination of the above.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for decoding a signal received over a channel from a transmitter comprising:
    decoding a received signal having a first bit and a second bit based on a coupling of the first bit to the second bit introduced by at least one of the channel or the transmitter;
    wherein decoding a received signal having a first bit and a second bit based on a coupling of the first bit to the second bit introduced by at least one of the channel or the transmitter comprises:
    demodulating the received signal to provide unadjusted soft information associated with the first bit;
    forward error correction decoding the received signal based on the provided unadjusted soft information associated with the first bit and based on adjusted soft information associated with the second bit; and
    providing soft information associated with the second bit based on the forward error correction decoding of the first bit and the coupling of the second bit to the first bit to provide the adjusted soft information associated with the second bit.

2. The method of claim 1 wherein forward error correction decoding the received signal based on the provided unadjusted soft information associated with the first bit and based on adjusted soft information associated with the second bit further comprises:
    forward error correction decoding the first bit based on the unadjusted soft information associated with the first bit; and
    forward error correction decoding the second bit based on the adjusted soft information associated with the second bit.

3. The method of claim 2 wherein providing soft information associated with the second bit based on the forward error correction decoding of the first bit and the coupling of the second bit to the first bit to provide the adjusted soft information associated with the second bit further comprises providing first state soft information associated with the second bit based on a first state path history for the first bit and second state soft information associated with the second bit based on a second state path history for the first bit.

4. The method of claim 1 wherein the coupling of the first bit to the second bit introduced by at least one of the channel or the transmitter is provided by at least one of a modulation scheme used at the transmitter to generate a symbol for transmission including the first bit and the second bit, pulse shaping used at the transmitter and multi-path dispersion of the channel.

5. The method of claim 4 wherein the modulation scheme is 8-PSK and the pulse shaping is Nyquist pulse shaping.

6. The method of claim 4 wherein the pulse shaping is partial response pulse shaping.

7. The method of claim 4 wherein forward error correction decoding the received signal based on the provided unadjusted soft information associated with the first bit and based on adjusted soft information associated with the second bit comprises forward error correction decoding the received signal using a fixed-lag MAP decoder to produce likelihoods associated with the first bit and the second bit based on partially processed received symbols.

8. The method of claim 4 wherein forward error correction decoding the received signal based on the provided unadjusted soft information associated with the first bit and based on adjusted soft information associated with the second bit comprises forward error correction decoding the received signal using a maximum likelihood sequence estimation (MLSE) decoder using a soft output Viterbi algorithm (SOVA).

9. The method of claim 4 wherein forward error correction decoding the received signal based on the provided unadjusted soft information associated with the first bit and based on adjusted soft information associated with the second bit comprises forward error correction decoding the received signal using a block code with soft decoding based on a trellis.

10. The method of claim 4 wherein providing soft information associated with the second bit based on the forward error correction decoding of the first bit and the coupling of the second bit to the first bit to provide the adjusted soft information associated with the second bit further comprises providing the soft information as a conditional loglikelihood associated with the second bit.

11. The method of claim 1 wherein providing soft information associated with the second bit based on the forward error correction decoding of the first bit and the coupling of the second bit to the first bit to provide the adjusted soft information associated with the second bit comprises:

providing a plurality of symbol loglikelihoods associated with the second bit;

exponentiating the plurality of symbol loglikelihoods to provide symbol pseudo-likelihoods;

generating scaling factors for the plurality of symbol pseudo-likelihoods based on the unadjusted soft information associated with the first bit;

applying the scaling factors to the plurality of symbol pseudo-likelihoods;

accumulating each of the scaled plurality of symbol pseudo-likelihoods associated with a first bit state to provide a first accumulated value and accumulating each of the scaled plurality of symbol pseudo-likelihoods associated with a second bit state to provide a second accumulated value; and then generating a first logarithmic value from the first accumulated value and a second logarithmic value from the second accumulated value; and outputting the difference between the first logarithmic value and the second logarithmic value as the adjusted soft information associated with the second bit.

12. The method of claim 1 wherein providing soft information associated with the second bit based on the forward error correction decoding of the first bit and the coupling of the second bit to the first bit to provide the adjusted soft information associated with the second bit comprises:

providing a plurality of symbol loglikelihoods associated with the second bit;

passing selected ones of the plurality of symbol loglikelihoods to one of a first register associated with a first bit state and a second register associated with a second bit state based on the unadjusted soft information associated with the first bit;

selecting a best one of the passed plurality of symbol loglikelihoods for each of the first register and the second register; and outputting the difference between the selected best one of the passed plurality of symbol loglikelihoods for the first register and the second register as the adjusted soft information associated with the second bit.

13. A method for decoding a signal received over a channel from a transmitter comprising:

decoding a received signal having a first bit and a second bit based on a coupling of the first bit to the second bit introduced by at least one of the channel or the transmitter;

wherein the coupling of the first bit to the second bit is introduced by a modulation scheme used at the transmitter to generate a symbol for transmission including the first bit and the second bit and wherein decoding a received signal having a first bit and a second bit based on a coupling of the first bit to the second bit introduced by at least one of the channel or the transmitter comprises:

demodulating the received signal to provide demodulator intermediate soft values associated with the first bit and the second bit;

decoding the received signal to provide decoder intermediate soft value information for the first bit;

determining whether the decoder intermediate soft value information for the first bit is available;

generating an output demodulator soft value associated with the second bit based on the decoder intermediate soft value information for the first bit and the demodulator intermediate soft value associated with the second bit if the decoder intermediate soft value information for the first bit is available;

providing the demodulator intermediate soft value associated with the second bit as the output demodulator soft value associated with the second bit if the decoder intermediate soft value information for the first bit is not available; and decoding the received signal based on the output demodulator soft value associated with the second bit.

14. The method of claim 13 wherein decoding the received signal to provide decoder intermediate soft value information for the first bit is preceded by selecting a start bit for initiating decoding of the received signal based on demodulator intermediate soft values associated with bits of the received signal.

15. A method for decoding a signal received over a channel from a transmitter comprising:

decoding a received signal having a first bit and a second bit based on a coupling of the first bit to the second bit introduced by at least one of the channel or the transmitter;

wherein decoding a received signal having a first bit and a second bit based on a coupling of the first bit to the second bit introduced by at least one of the channel or the transmitter further comprises:

demodulating the received signal to provide unadjusted soft information associated with the first bit and unadjusted soft information associated with the second bit;

forward error correction decoding the received signal based on the provided unadjusted soft information associated with the first bit and the provided unadjusted soft information associated with the second bit;

providing soft information associated with the second bit based on the forward error correction decoding of the first bit and the coupling of the second bit to the first bit to provide adjusted soft information associated with the second bit and providing soft information associated with the first bit based on the forward error correction decoding of the second bit and the coupling of the second bit to the first bit to provide adjusted soft information associated with the first bit; and forward error correction decoding the first bit and the second bit based on the adjusted soft information associated with the first bit and the second bit.

16. The method of claim 15 wherein forward error correction decoding the received signal based on the provided unadjusted soft information associated with the first bit and the provided unadjusted soft information associated with the second bit comprises the step of convolutional decoding the received signal based on the provided unadjusted soft information associated with the first bit and the provided unadjusted soft information associated with the second bit and wherein forward error correction decoding the first bit and the second bit based on the adjusted soft information associated with the first bit and the second bit comprises convolutional decoding the first bit and the second bit based on the adjusted soft information associated with the first bit and the second bit.

17. The method of claim 15 wherein the coupling of the first bit to the second bit introduced by at least one of the channel or the transmitter is provided by at least one of a modulation scheme used at the transmitter to generate a symbol for transmission including the first bit and the second bit, pulse shaping used at the transmitter and multipath dispersion of the channel.

18. The method of claim 17 wherein the modulation scheme is 8-PSK and the pulse shaping is Nyquist pulse shaping.

19. The method of claim 17 wherein the pulse shaping is partial response pulse shaping.

20. The method of claim 15 further comprising repeating the steps of providing soft information and forward error correction decoding the first bit and the second bit for a plurality of passes with updated soft information associated with the first bit and the second bit from a pass being utilized in a subsequent pass until a quality criteria is satisfied.

21. A method according to claim 20 wherein the quality criteria is a successful error detection code test.

22. A method according to claim 15 further comprising repeating for a selected number of passes providing soft information associated with the second bit based on the forward error correction decoding of the first bit and the coupling of the second bit to the first bit to provide adjusted soft information associated with the second bit and providing soft information associated with the first bit based on the forward error correction decoding of the second bit and the coupling of the second bit to the first bit to provide adjusted soft information associated with the first bit and forward error correction decoding the first bit and the second bit based on the adjusted soft information associated with the first bit and the second bit, with updated soft information associated with the first bit and the second bit from a pass being utilized in a subsequent pass.

23. A method for decoding a signal received over a channel from a transmitter comprising:
    decoding a received signal having a first bit and a second bit based on a coupling of the first bit to the second bit introduced by at least one of the channel or the transmitter;
    wherein decoding a received signal having a first bit and a second bit based on a coupling of the first bit to the second bit introduced by at least one of the channel or the transmitter comprises:
    demodulating the received signal to provide demodulator intermediate soft values associated with the first bit and the second bit;
    storing the demodulator intermediate soft values;
    forward error correction decoding the received signal based on the demodulator intermediate soft values to provide decoder intermediate soft values associated with the first bit and the second bit;
    adjusting the demodulator intermediate soft values based on the decoder intermediate soft values associated with the first bit and the second bit; and
    repeating forward error correction decoding the received signal based on the demodulator intermediate soft values to provide decoder intermediate soft values associated with the first bit and the second bit using the adjusted demodulator intermediate soft values.

24. The method according to claim 23 wherein repeating forward error correction decoding the received signal based on the demodulator intermediate soft values to provide decoder intermediate soft values associated with the first bit and the second bit using the adjusted demodulator intermediate soft values further comprises repeating forward error correction decoding the received signal based on the demodulator intermediate soft values to provide decoder intermediate soft values associated with the first bit and the second bit and adjusting the demodulator intermediate soft values based on the decoder intermediate soft values associated with the first bit and the second bit, for a selected number of passes.

25. A method for decoding a signal received over a channel from a transmitter comprising:
    demodulating a received signal having a first bit and a second bit, the second bit having a coupling to the first bit introduce by at least one of the channel or the transmitter, to provide unadjusted soft information associated with the first bit;
    forward error correction decoding the received signal based on the provided unadjusted soft information associated with the first bit;
    providing path independent soft information associated with the second bit based on the forward error correction decoding of the first bit and the coupling of the second bit to the first bit to provide adjusted soft information associated with the second bit; and
    wherein forward error correction decoding the received signal based on the provided unadjusted soft information associated with the first bit further comprises the step of forward error correction decoding the received signal based on the adjusted soft information associated with the second bit.

26. A method for decoding a signal received over a channel from a transmitter comprising:
    demodulating a received signal having a first bit and a second bit, the second bit having a coupling to the first bit introduce by at least one of the channel or the transmitter to provide unadjusted soft information associated with the first bit and unadjusted soft information associated with the second bit;
    forward error correction decoding the received signal based on the provided unadjusted soft information associated with the first bit and the provided unadjusted soft information associated with the second bit;
    providing soft information associated with the second bit based on the forward error correction decoding of the first bit and the coupling of the second bit to the first bit to provide adjusted soft information associated with the second bit and providing soft information associated with the first bit based on the forward error correction decoding of the second bit and the coupling of the second bit to the first bit to provide adjusted soft information associated with the first bit; and
    forward error correction decoding the first bit and the second bit based on the adjusted soft information associated with the first bit and the second bit.

27. A baseband processor for decoding a signal received over a channel from a transmitter comprising:
    a demodulator that demodulates the received signal to provide demodulator soft information associated with a plurality of bits in the received signal;
    an intermediate value memory configured to store the demodulator soft information associated with a plurality of bits in the received signal;
    a soft information generator circuit coupled to the intermediate value memory;

a decoder configured to process soft information associated with the plurality of bits in the received signal from the soft information generator circuit to provide decoder soft information associated with ones of the plurality of bits in the received signal; and wherein the soft information generator circuit is configured to generate the soft information associated with the plurality of bits in the received signal based on a coupling of one of the plurality of bits to another of the plurality of bits introduced by at least one of the channel or the transmitter and responsive to the decoder soft information associated with ones of the plurality of bits in the received signal.

28. The baseband processor of claim 27 wherein the coupling of one of the plurality of bits to another of the plurality of bits is based on at least one of a modulation scheme used at the transmitter to generate a symbol for transmission including the first bit and the second bit, pulse shaping used at the transmitter and multi-path dispersion of the channel.

29. The baseband processor of claim 28 wherein the modulation scheme is 8-PSK and the pulse shaping is Nyquist pulse shaping.

30. The baseband processor of claim 28 wherein the pulse shaping is partial response pulse shaping.

31. The baseband processor of claim 28 wherein the soft information generator circuit is an interactive soft information generator circuit and wherein the decoder is a forward error correction (FEC) decoder with intermediate output.

32. The baseband processor of claim 31 wherein the interactive soft information generator circuit comprises:

an exponentiation circuit configured to receive the demodulator soft information that exponentiates the demodulator soft information;

a scaling circuit coupled to the exponentiation circuit that scales the exponentiated soft information responsive to the decoder soft information associated with ones of the plurality of bits in the received signal;

an accumulation circuit having a first accumulator that accumulates scaled exponentiated soft information associated with a first bit state and a second accumulator that accumulates scaled exponentiated soft information associated with a second bit state; and a combiner circuit that outputs a difference between a logarithm of the accumulated scaled exponentiated soft information associated with a first bit state and a logarithm of the accumulated scaled exponentiated soft information associated with a second bit state as the soft information associated with the plurality of bits in the received signal.

33. The baseband processor of claim 28 wherein the interactive soft information generator circuit comprises:

a gating circuit configured to output demodulator soft information associated with the plurality of bits in the received signal responsive to the soft information associated with the plurality of bits so as to selectively output demodulator soft information associated with symbol states indicated by the soft information associated with the plurality of bits;

a best value selection circuit having a first register that stores a best demodulator soft information output associated with a first bit state and a second register that stores a best demodulator soft information output associated with a second bit state; and a combiner circuit that outputs a difference between the best demodulator soft information output associated with the first bit state and the best demodulator soft information output associated with the second bit state as the soft information associated with the plurality of bits in the received signal.

34. The baseband processor of claim 28 wherein the soft information generator circuit is a multipass soft information generator circuit and wherein the decoder is a FEC decoder with soft coded bit output.

35. The baseband processor of claim 28 wherein the soft information generator circuit is a per survivor processing (PSP) interactive soft information generator circuit and wherein the decoder is a PSP forward error correction (FEC) decoder with intermediate output.

36. A system for decoding a signal received over a channel from a transmitter comprising:

a receiver configured to receive the signal; and means for decoding a received signal having a first bit and a second bit based on a coupling of the first bit to the second bit introduced by at least one of the channel or the transmitter; and wherein the means for decoding a received signal having a first bit and a second bit based on a coupling of the first bit to the second bit introduced by at least one of the channel or the transmitter comprises:

means for demodulating the received signal to provide unadjusted soft information associated with the first bit;

means for forward error correction decoding the received signal based on the provided unadjusted soft information associated with the first bit;

means for providing soft information associated with the second bit based on the forward error correction decoding of the first bit and the coupling of the second bit to the first bit to provide adjusted soft information associated with the second bit; and wherein the means for forward error correction decoding the received signal further comprises means for forward error correction decoding the received signal based on the adjusted soft information associated with the second bit.

37. The system of claim 36 wherein the coupling of the first bit to the second bit introduced by at least one of the channel or the transmitter is provided by at least one of a modulation scheme used at the transmitter to generate a symbol for transmission including the first bit and the second bit, pulse shaping used at the transmitter and multi-path dispersion of the channel.

38. The system of claim 37 wherein the means for forward error correction decoding comprises a fixed-lag MAP decoder configured to produce likelihood information associated with the first bit and the second bit based on partially processed received symbols.

39. The system of claim 37 wherein the means for forward error correction decoding comprises a maximum likelihood sequence estimation (MLSE) decoder using a soft output Viterbi algorithm (SOVA).

40. The system of claim 37 wherein the means for forward error correction decoding comprises a block code circuit with soft decoding based on a trellis.

41. A system for decoding a signal received over a channel from a transmitter comprising:

a receiver configured to receive the signal; and means for decoding a received signal having a first bit and a second bit based on a coupling of the first bit to the second bit introduced by at least one of the channel or the transmitter; and wherein the means for decoding further comprises:
- means for demodulating the received signal to provide unadjusted soft information associated with the first bit and unadjusted soft information associated with the second bit;
- means for forward error correction decoding the received signal based on the provided unadjusted soft information associated with the first bit and the provided unadjusted soft information associated with the second bit;
- means for providing soft information associated with the second bit based on the forward error correction decoding of the first bit and the coupling of the second bit to the first bit to provide adjusted soft information associated with the second bit and providing soft information associated with the first bit based on the forward error correction decoding of the second bit and the coupling of the second bit to the first bit to provide adjusted soft information associated with the first bit; and
- means for forward error correction decoding the first bit and the second bit based on the adjusted soft information associated with the first bit and the second bit.

42. The system of claim 41 wherein the coupling of the first bit to the second bit introduced by at least one of the channel or the transmitter is provided by at least one of a modulation scheme used at the transmitter to generate a symbol for transmission including the first bit and the second bit, pulse shaping used at the transmitter and multi-path dispersion of the channel.

43. A wireless terminal comprising:
- a receiver that receives a signal over a channel from a transmitter; and
- a baseband processor comprising:
  - a demodulator that demodulates the received signal to provide demodulator soft information associated with a plurality of bits in the received signal;
  - an intermediate value memory configured to store the demodulator soft information associated with a plurality of bits in the received signal;
  - a soft information generator circuit coupled to the intermediate value memory;
  - a decoder configured to process soft information associated with the plurality of bits in the received signal from the soft information generator circuit to provide decoder soft information associated with ones of the plurality of bits in the received signal; and
  - wherein the soft information generator circuit is configured to generate the soft information associated with the plurality of bits in the received signal based on a coupling of one of the plurality of bits to another of the plurality of bits introduced by at least one of the channel or the transmitter and responsive to the decoder soft information associated with ones of the plurality of bits in the received signal.

44. The wireless terminal of claim 43 wherein the coupling of one of the plurality of bits to another of the plurality of bits is based on at least one of a modulation scheme used at the transmitter to generate a symbol for transmission including the first bit and the second bit, pulse shaping used at the transmitter and multi-path dispersion of the channel.

45. The wireless terminal of claim 44 wherein the modulation scheme is 8-PSK and the pulse shaping is Nyquist pulse shaping.

46. The wireless terminal of claim 44 wherein the pulse shaping is partial response pulse shaping.

47. The wireless terminal of claim 44 wherein the soft information generator circuit is an interactive soft information generator circuit and wherein the decoder is a forward error correction (FEC) decoder with intermediate output.

48. The wireless terminal of claim 47 wherein the interactive soft information generator circuit comprises:
- an exponentiation circuit configured to receive the demodulator soft information that exponentiates the demodulator soft information;
- a scaling circuit coupled to the exponentiation circuit that scales the exponentiated soft information responsive to the decoder soft information associated with ones of the plurality of bits in the received signal;
- an accumulation circuit having a first accumulator that accumulates scaled exponentiated soft information associated with a first bit state and a second accumulator that accumulates scaled exponentiated soft information associated with a second bit state; and
- a combiner circuit that outputs a difference between a logarithm of the accumulated scaled exponentiated soft information associated with a first bit state and a logarithm of the accumulated scaled exponentiated soft information associated with a second bit state as the soft information associated with the plurality of bits in the received signal.

49. The wireless terminal of claim 44 wherein the interactive soft information generator circuit comprises:
- a gating circuit configured to output demodulator soft information associated with the plurality of bits in the received signal responsive to the soft information associated with the plurality of bits so as to selectively output demodulator soft information associated with symbol states indicated by the soft information associated with the plurality of bits;
- a best value selection circuit having a first register that stores a best demodulator soft information output associated with a first bit state and a second register that stores a best demodulator soft information output associated with a second bit state; and
- a combiner circuit that outputs a difference between the best demodulator soft information output associated with the first bit state and the best demodulator soft information output associated with the second bit state as the soft information associated with the plurality of bits in the received signal.

50. The wireless terminal of claim 44 wherein the soft information generator circuit is a multipass soft information generator circuit and wherein the decoder is a FEC decoder with soft coded bit output.

51. The wireless terminal of claim 44 wherein the soft information generator circuit is a per survivor processing (PSP) interactive soft information generator circuit and wherein the decoder is a PSP forward error correction (FEC) decoder with intermediate output.

* * * * *